United States Patent [19]
Sakae et al.

[11] Patent Number: 5,982,836
[45] Date of Patent: Nov. 9, 1999

[54] PHASE SYNCHRONIZER AND DATA REPRODUCING APPARATUS

[75] Inventors: Keisuke Sakae; Kimio Yoshikawa, both of Kasugai, Japan

[73] Assignee: Fujitsu Limited, Kanagawa, Japan

[21] Appl. No.: 08/831,948

[22] Filed: Apr. 2, 1997

Related U.S. Application Data

[62] Division of application No. 08/552,256, Nov. 2, 1995, Pat. No. 5,657,359.

[30] Foreign Application Priority Data

Nov. 4, 1994 [JP] Japan .................................. 6-271485
Jun. 29, 1995 [JP] Japan .................................. 7-164174

[51] Int. Cl.$^6$ .................................................. H03D 3/24
[52] U.S. Cl. .............................. 375/376; 331/17; 331/34; 327/157; 327/159
[58] Field of Search .......................... 375/376; 331/1 R, 331/14, 17, 25, 34, 1 A; 327/147, 148, 150, 156, 157, 159

[56] References Cited

U.S. PATENT DOCUMENTS

| | | |
|---|---|---|
| 4,464,771 | 8/1984 | Sorensen . |
| 4,656,369 | 4/1987 | Lou . |
| 5,075,639 | 12/1991 | Taya . |
| 5,136,260 | 8/1992 | Yousefi-Elezei . |
| 5,285,483 | 2/1994 | Ogawa et al. ........................... 375/376 |
| 5,334,952 | 8/1994 | Maddy et al. ........................... 331/1 A |
| 5,359,298 | 10/1994 | Abe . |
| 5,375,148 | 12/1994 | Parker et al. ........................... 375/376 |
| 5,422,604 | 6/1995 | Jokura . |
| 5,497,126 | 3/1996 | Kosiec et al. ........................... 331/1 A |
| 5,614,870 | 3/1997 | Sauer et al. ............................... 331/14 |

Primary Examiner—Don N. Vo
Attorney, Agent, or Firm—Nikaido Marmelstein Murray & Oram LLP

[57] ABSTRACT

A phase synchronizer is disclosed that provides a stable output signal while improving synchronization speed. The phase synchronizer includes one or two feedback circuits. The feedback circuit(s) includes a phase comparator for generating a pulse signal in accordance with a difference between the phases of an input signal and a feedback signal, a charge pump for converting the pulse signal supplied from the phase comparator to an analog voltage signal, a loop filter for removing high-frequency signal components from the analog voltage signal output from the charge pump and supplying as a filtered analog voltage signal (LF1 or LF2), and a voltage-controlled oscillator coupled to the loop filter for generating an oscillation output signal having a frequency which varies in accordance with the filtered analog signal (LF1 or LF2). The oscillation output signal is also supplied as the feedback signal to the phase comparator.

4 Claims, 17 Drawing Sheets

PHASE SYNCHRONIZER AND DATA REPRODUCING APPARATUS

This is a divisional of application Ser. No. 08/552,256 filed Nov. 2, 1995 now U.S. Pat. No. 5,657,359.

BACKGROUND OF THE INVENTION

1. Field of the Invention

The present invention relates to a phase synchronizer which produces an output signal having a frequency synchronized with an input signal.

2. Description of the Related Art

A disk recording apparatus which uses a magnetic disk as one of various kinds of data recording media comprises a data writer for writing desired data on the magnetic disk and a data reader for reading data written on the magnetic disk. To read data included in a signal to be read from the magnetic disk, the data reader needs a sync signal which has the same frequency as that of the read signal and is in phase with the read signal. To increase the speed of the reading operation, the data reader should quickly produce a stable sync signal.

FIG. 1 shows a block diagram of a conventional phase synchronizer which is installed in a magnetic disk recording apparatus. A phase comparator 1, a frequency comparator 2 and a sync detector 3 receive an input signal $f_{in}$ read from a magnetic disk. The phase comparator 1, frequency comparator 2 and sync detector 3 also receive an output signal $f_{out}$ of a voltage controlled oscillator (hereinafter called VCO) 4.

The phase comparator 1 outputs a pulse signal to a selector 5 in accordance with the phase difference between the input signal $f_{in}$ and the output signal $f_{out}$. The frequency comparator 2 outputs a pulse signal to the selector 5 in accordance with the frequency difference between the input signal $f_{in}$ and the output signal $f_{out}$. When the frequency of the input signal $f_{in}$ coincides with that of the output signal $f_{out}$, the sync detector 3 sends out a select signal to the selector 5.

When not receiving the select signal from the sync detector 3, the selector 5 outputs the output signal of the frequency comparator 2 to a charge pump 6. When receiving the select signal from the sync detector 3, the selector 5 outputs the output signal of the phase comparator 1 to the charge pump 6.

The charge pump 6 sends out an analog voltage signal to a loop filter 7 in accordance with the pulse width of the output signal of the phase comparator 1 or the frequency comparator 2. The loop filter 7, which is constituted of a low-pass filter, removes the high-frequency component from the analog voltage signal from the charge pump 6 and outputs a filtered analog voltage signal to the VCO 4.

The VCO 4 outputs the oscillator output signal $f_{out}$ having a frequency based on the filtered analog voltage output from the loop filter 7.

In the thus constituted phase synchronizer, when the data reading position on, for example, a magnetic disk is changed, the frequency of the input signal $f_{in}$ varies. As a result, the frequency difference between the input signal $f_{in}$ and the oscillator output signal $f_{out}$ of the VCO 4 becomes larger so that the sync detector 3 does not send out the select signal.

Accordingly, the selector 5 outputs the output signal of the frequency comparator 2 to the charge pump 6, which in turn boosts or drops the analog output voltage in accordance with the pulse width of the output signal of the frequency comparator 2.

The loop filter 7 smoothes the analog output voltage of the charge pump 6 and sends the filtered analog voltage signal to the VCO 4. The VCO 4 outputs the oscillator output signal $f_{out}$ having a frequency based on the filtered analog output voltage from the loop filter 7.

The oscillator output signal $f_{out}$ of the VCO 4 is fed back to the frequency comparator 2. The feedback in this situation allows the VCO 4 to converge the frequency of the oscillator output signal $f_{out}$ to the frequency of the input signal $f_{in}$.

When the frequency of the oscillator output signal $f_{out}$ matches the input signal $f_{in}$, the sync detector 3 sends the select signal to the selector 5. Consequently, the selector 5 selects the phase comparator 1 over the frequency comparator 2. The selector 5 sends out the output signal of the phase comparator 1 to the charge pump 6. The charge pump 6 boosts or drops the analog output voltage in accordance with the pulse width of the output signal of the phase comparator 1.

The oscillator output signal $f_{out}$ of the VCO 4 is also fed back to the phase comparator 1. The feedback in this situation operates to reduce the phase difference between the input signal $f_{in}$ and the oscillator output signal $f_{out}$, and the data reading operation is executed based on this oscillator output signal $f_{out}$.

In the above-described phase synchronizer, when the output signal of the frequency comparator 2 is provided via the selector 5 to the charge pump 6, there is a frequency difference between the input signal $f_{in}$ and the output signal $f_{out}$.

To improve the synchronizing speed by which the frequency of the output signal $f_{out}$ converges to the frequency of the input signal $f_{in}$ in accordance with the analog output voltage signal of the charge pump 6, the VCO 4 should have a high gain. That is, it is desirable that a change in the frequency of the filtered analog output signal of the VCO 4 be greater than a change in the filtered analog output voltage signal of the loop filter 7.

When the output signal of the phase comparator 1 is provided via the selector 5 to the charge pump 6, on the other hand, the frequency of the input signal $f_{in}$ matches that of the output signal $f_{out}$ and only a phase difference is present. In this case, to make the phase of the output signal $f_{out}$ promptly coincide with that of the input signal $f_{in}$ in accordance with the analog output voltage signal of the charge pump 6 and to stabilize the phase of the output signal $f_{out}$, the gain of the VCO 4 should be low. That is, it is desirable that a change in the frequency of the output signal of the VCO 4 be smaller than a change in the filtered analog output voltage of the loop filter 7.

While setting the gain of the VCO 4 to a high gain improves the synchronization speed, the VCO 4 becomes overly sensitive to a slight phase-difference signal output from the phase comparator 1 so that its oscillator output signal $f_{out}$ does not stabilize. On the other hand, while setting the gain of the VCO 4 a low gain stabilizes the oscillator output signal $f_{out}$, the synchronization speed becomes slower. Thus, the conventional phase synchronizer is unable to stabilize the output signal $f_{out}$ while improving the synchronization speed.

SUMMARY OF THE INVENTION

Accordingly, the present invention provides a phase synchronizer that stabilizes the output signal while improving the synchronization speed. The phase synchronizers of this invention are particularly suited for use with a data reproducing apparatus which can improve the data recording density of a recording medium by using the above phase synchronizer.

In a first embodiment of the invention, a phase synchronizer includes two feedback circuits. The first feedback circuit includes a phase comparator for generating a first pulse signal in accordance with a difference between the phases of a first input signal and a first feedback signal, a first charge pump for converting the first pulse signal supplied from the first phase comparator to a first analog voltage signal, a first loop filter for removing high-frequency signal components from the first analog voltage signal output from the first charge pump and supplying as a first filtered analog voltage signal (LF1), and a first voltage-controlled oscillator coupled to the first loop filter for generating a first oscillation output signal having a first frequency which varies in accordance with the first filtered analog signal (LF1). The first oscillation output signal is also supplied as the first feedback signal to the first phase comparator. The second feedback circuit includes a second phase comparator for generating a second pulse signal in accordance with a difference between phases of a second input signal and a second feedback signal, a second charge pump, a second loop filter to output a second filtered analog voltage signal (LF2), and a second voltage-controlled oscillator coupled to the first loop filter as well as the second loop filter for generating a second oscillation output signal ($f_{out2}$) having a second frequency which varies in accordance with the first and second filtered analog voltage signals (LF1, LF2). The second oscillation output signal is then supplied as the second feedback signal to the second phase comparator and also output as a final output of the phase synchronizer. The second frequency of the second oscillation output signal ($f_{out2}$) changes to a greater extent with respect to a change in voltage of the first filtered analog voltage signal (LF1) than with respect to a change in voltage of the second filtered analog voltage signal (LF2). The phase synchronizer's first feedback circuit may further include a frequency divider, provided between the first voltage-controlled oscillator and the first phase comparator, for dividing the first frequency by a predetermined frequency-dividing ratio to produce a frequency-divided signal, which is supplied to the first phase comparator as the first feedback signal. The frequency-dividing ratio is set such that the frequency of the frequency-divided signal matches the frequency of a data signal serving as the second input signal.

In a second embodiment of the invention, a phase synchronizer includes a feedback circuit composed of a phase comparator for generating a pulse signal in accordance with a difference between phases of an input signal and a feedback signal, a charge pump for converting the pulse signal supplied from the phase comparator to a first analog voltage signal, a loop filter for removing high-frequency signal components from the first analog voltage signal output from the charge pump and produce a first filtered analog voltage signal, and a voltage-controlled oscillator coupled to the loop filter. The phase synchronizer further includes a synchronization accelerating circuit coupled to the loop filter and to the voltage-controlled oscillator. When the voltage potential of the first filtered analog voltage signal (LF2) is not within a predetermined voltage range, the synchronization accelerating circuit supplies the voltage-controlled oscillator with a voltage signal having a second analog voltage potential within the predetermined voltage range. Additionally, the voltage-controlled oscillator generates an oscillation output signal having a larger gain with respect to the voltage potential of the second analog voltage signal than with respect to the voltage potential of the first filtered analog voltage signal (LF2), and the oscillation output signal is supplied as the feedback signal to the phase comparator and output as a final output of the phase synchronizer.

In third and fourth embodiments of the invention, a data reproducing apparatus includes a data reading unit and a controller for the data reading unit. The data reading unit generates an oscillation output signal at a frequency synchronous with that of a record signal originating from a recording medium so as to reproduce data from the recording medium based on the oscillation output signal. In the third embodiment, the data reading unit includes a phase synchronizer composed of a first feedback circuit and a second feedback circuit constructed according to the first embodiment. In the fourth embodiment, the data reading unit includes a phase synchronizer composed of a feedback circuit constructed according to the second embodiment.

BRIEF DESCRIPTION OF THE DRAWINGS

The invention, together with the advantages thereof, may best be understood by reference to the following description of the presently preferred embodiments together with the accompanying drawings in which:

FIGS. 2 through 12 illustrate a first embodiment of this invention, in which

FIG. 2 is a basic block diagram of the first embodiment of this invention.

FIG. 3 is a block diagram showing a magnetic disk apparatus;

FIG. 4 is a block diagram for explaining a phase synchronizer;

FIG. 5 is a circuit diagram for explaining a first feedback loop circuit;

FIG. 6 is a circuit diagram for explaining a frequency divider;

FIG. 7 is a circuit diagram for explaining a flip-flop circuit which constitutes the frequency divider;

FIG. 8 is a timing chart for explaining the operation of the flip-flop circuit;

FIG. 9 is a timing chart for explaining the operation of the frequency divider;

FIG. 10 is a circuit diagram for explaining a VCO;

FIG. 11 is a circuit diagram for explaining a bias circuit of the VCO; and

FIG. 12 is a timing chart for explaining the operation of the phase synchronizer.

FIGS. 14 through 17 illustrate a third embodiment of this invention, in which

FIG. 14 is a circuit diagram for explaining a phase synchronizer;

FIG. 15 is a circuit diagram for explaining a center-frequency setting register;

FIG. 16 is a circuit diagram for explaining a D/A converter; and

FIG. 17 is an input vs. output characteristic chart of a VCO.

FIGS. 18 and 19 illustrate a fourth embodiment of this invention, in which

FIG. 18 is et circuit diagram for explaining a phase synchronizer; and

FIG. 19 is a circuit diagram for explaining an A/D converter.

DETAILED DESCRIPTION OF THE PREFERRED EMBODIMENTS

FIRST EMBODIMENT

Figure 1:
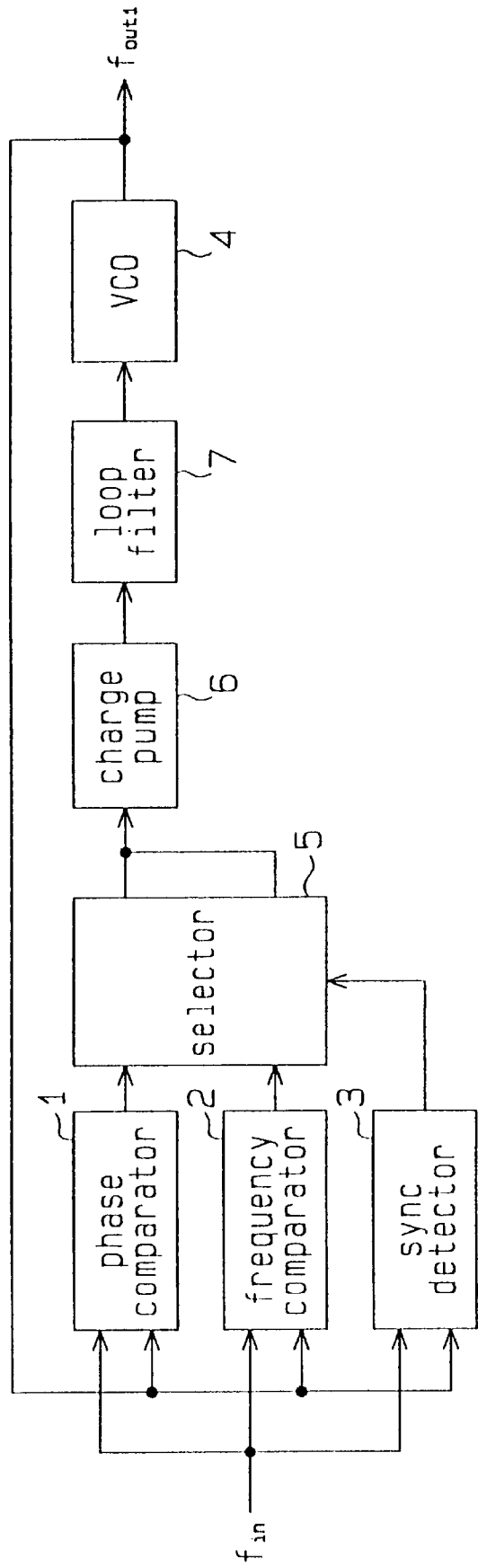
FIG. 1 is a block diagram for explaining an ordinary phase synchronizer.
Figure 2:
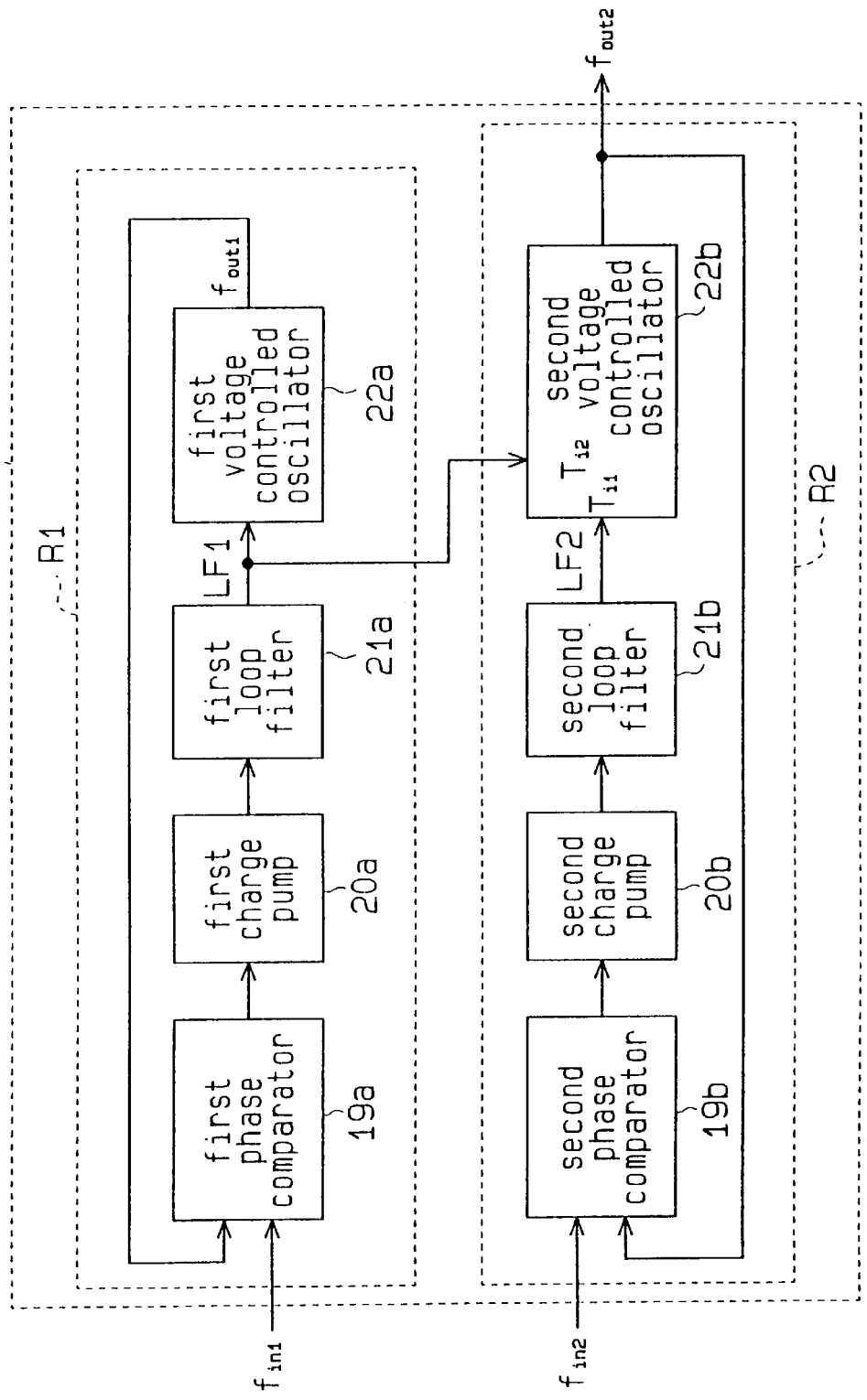

A data reproducing apparatus in a magnetic disk recording and reproducing apparatus according to the first embodiment of this invention will be described with reference to FIGS. 2 through 12. FIG. 2 is a basic block diagram of the first embodiment. The first embodiment pertains to a phase synchronizer that includes first and second feedback circuits R1 and R2. The structure and operation of the first and second feedback circuits R1 and R2 are discussed in detail below.

Figure 3:
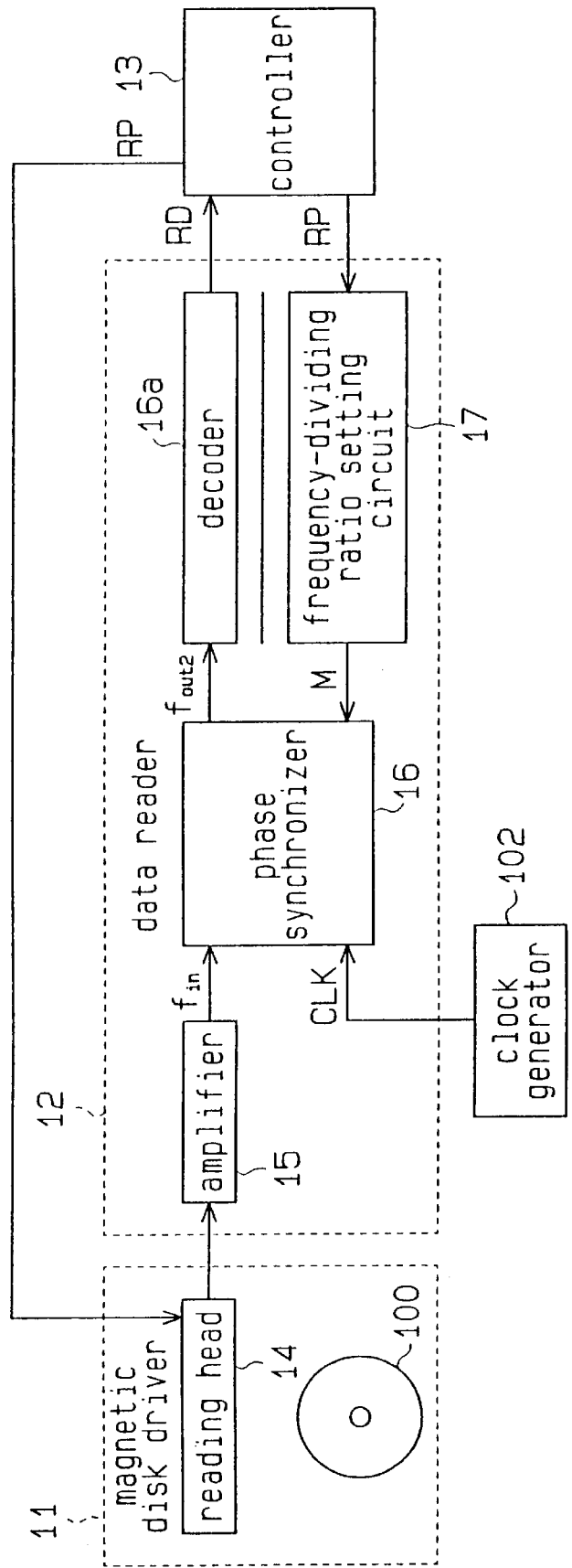

FIG. 3 shows the structure of the data reproducing apparatus in the magnetic disk recording and reproducing apparatus. The data reproducing apparatus includes a magnetic disk driver 11, a data reader 12 and a controller 13.

The magnetic disk driver 11 reads recorded signals recorded on a magnetic disk 100 with a reading head 14, and outputs the recorded signals to the data reader 12. The data reader 12 includes an amplifier 15, a phase synchronizer 16, a decoder 16a and a frequency-dividing ratio setting circuit 17. The amplifier 15 amplifies the recorded signal output from the reading head 14 and outputs it as an input signal $f_{in}$ to the phase synchronizer 16.

The phase synchronizer 16 outputs a signal, which has the same frequency as that of the received input signal $f_{in}$ and is in phase with the input signal $f_{in}$, to the decoder 16a as a synchronized signal $f_{out2}$. The decoder 16a decodes read data from the synchronized signal $f_{out2}$ and outputs the decoded signal RD to the controller 13.

The controller 13 controls the operations of the magnetic disk driver 11 and the data reader 12. The controller 13 sends a read position signal RP, which specifies the data reading position on the magnetic disk 100, to the frequency-dividing ratio setting circuit 17 in the data reader 12.

The frequency-dividing ratio setting circuit 17 has a frequency-dividing ratio table for setting a frequency-dividing ratio based on the data reading position on the magnetic disk 100. The setting circuit 17 selects a frequency-dividing ratio corresponding to the read position signal RP from the frequency-dividing ratio table and outputs this ratio as a frequency-dividing ratio setting signal M to the phase synchronizer 16.

Figure 4:
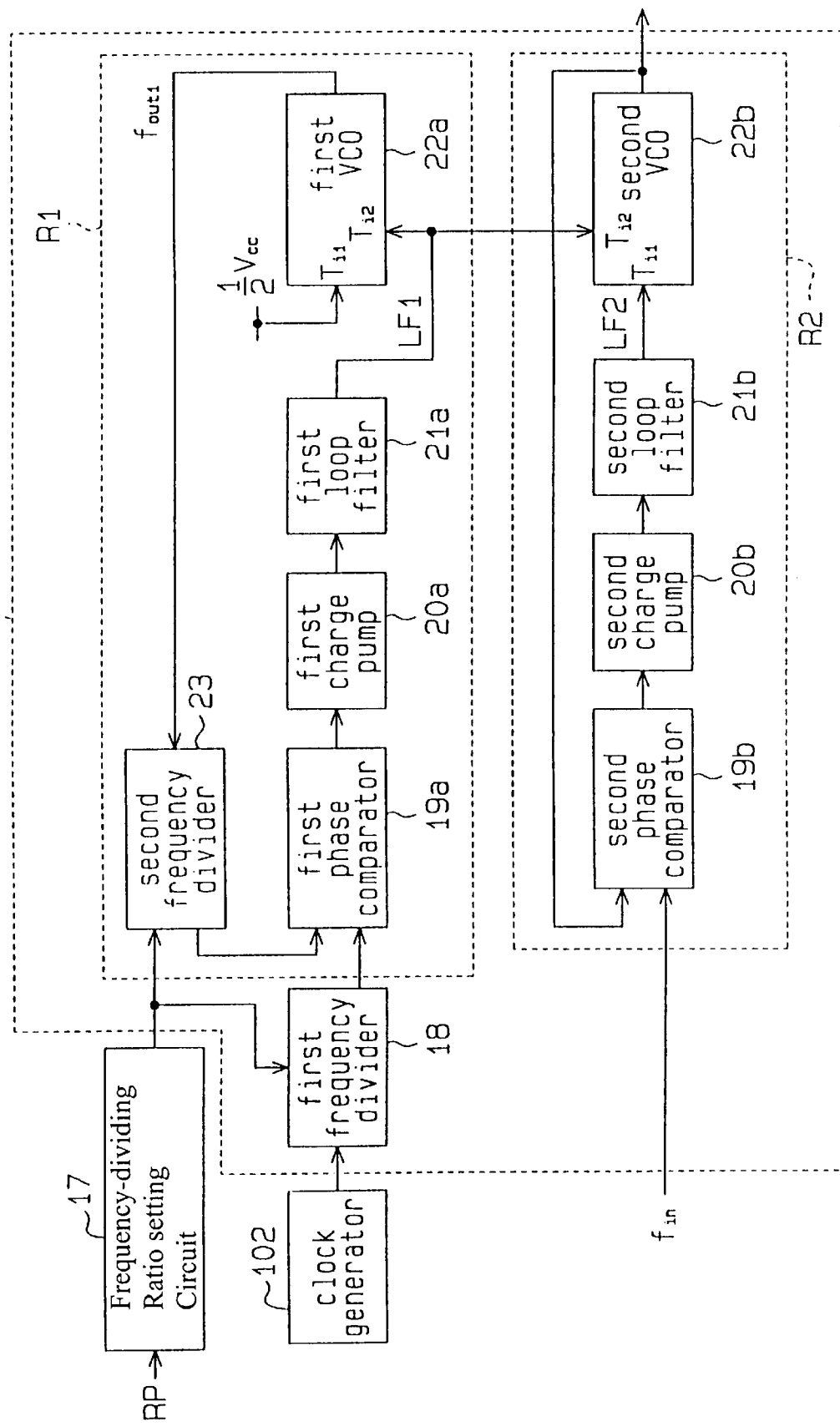

FIG. 4 is a block diagram showing the phase synchronizer 16. The phase synchronizer 16 has a first frequency divider 18 and first and second feedback circuits R1 and R2. A first feedback circuit R1 includes a first phase comparator 19a, a first charge pump 20a, a first loop filter 21a, a first VCO 22a and a second frequency divider 23. A second feedback circuit R2 includes a second phase comparator 19b, a second charge pump 20b, a second loop filter 21b and a second VCO 22b. The first frequency divider 18 receives a clock signal CLK from a clock generator 102 and also receives the frequency-dividing ratio setting signal M, then frequency-divides this clock signal CLK by the frequency-dividing ratio of the setting signal M and sends a first frequency-dividing signal to the first phase comparator 19a.

The first phase comparator 19a has an output terminal for providing a comparator output signal to the first charge pump 20a. The first charge pump 20a has an output terminal for providing an analog voltage signal to the first loop filter 21a. The first loop filter 21a has an output terminal for providing a filtered analog voltage signal LF1 having no high-frequency component to the first VCO 22a. The first VCO 22a has a first input terminal $T_{i1}$ to which a voltage of a one-half of a power supply $V_{cc}$ is applied as a constant voltage and also has a second input terminal $T_{i2}$ for receiving the filtered analog voltage signal LF1 from the first loop filter 21a.

The first VCO 22a further has an output terminal for providing a first oscillator signal $f_{out1}$ to the second frequency divider 23. The second frequency divider 23 frequency-divides this first oscillator signal $f_{out1}$ in accordance with the frequency-dividing ratio setting signal M and provides a second frequency-dividing signal to the first phase comparator 19a. The frequency-dividing ratio of the second frequency divider 23 is switched step by step according to the frequency-dividing ratio setting signal M.

The second phase comparator 19b receives the input signal $f_{in}$ from the amplifier 15. The second phase comparator 19b has an output terminal for providing a comparator output signal to the second charge pump 20b. The second charge pump 20b has an output terminal for providing an analog output voltage signal to the second loop filter 21b. The second loop filter 21b has an output terminal for providing a filtered analog voltage signal LF2. The second VCO 22b has a first input terminal $T_{i1}$ for receiving the filtered analog voltage signal LF2 from the second loop filter 21b and also has a second input terminal $T_{i2}$ for receiving a filtered analog voltage signal LF1 from the first loop filter 21a.

The second VCO 22b generates an oscillator output signal $f_{out2}$ having a frequency in accordance with the filtered analog voltage signals LF1 and LF2 output from both loop filters 21a and 21b. Then, the second VCO 22b provides the oscillator output signal $f_{out2}$ to the second phase comparator 19b and also provides the oscillator output signal $f_{out2}$ as a synchronized output signal of the phase synchronizer 16.

Figure 5:
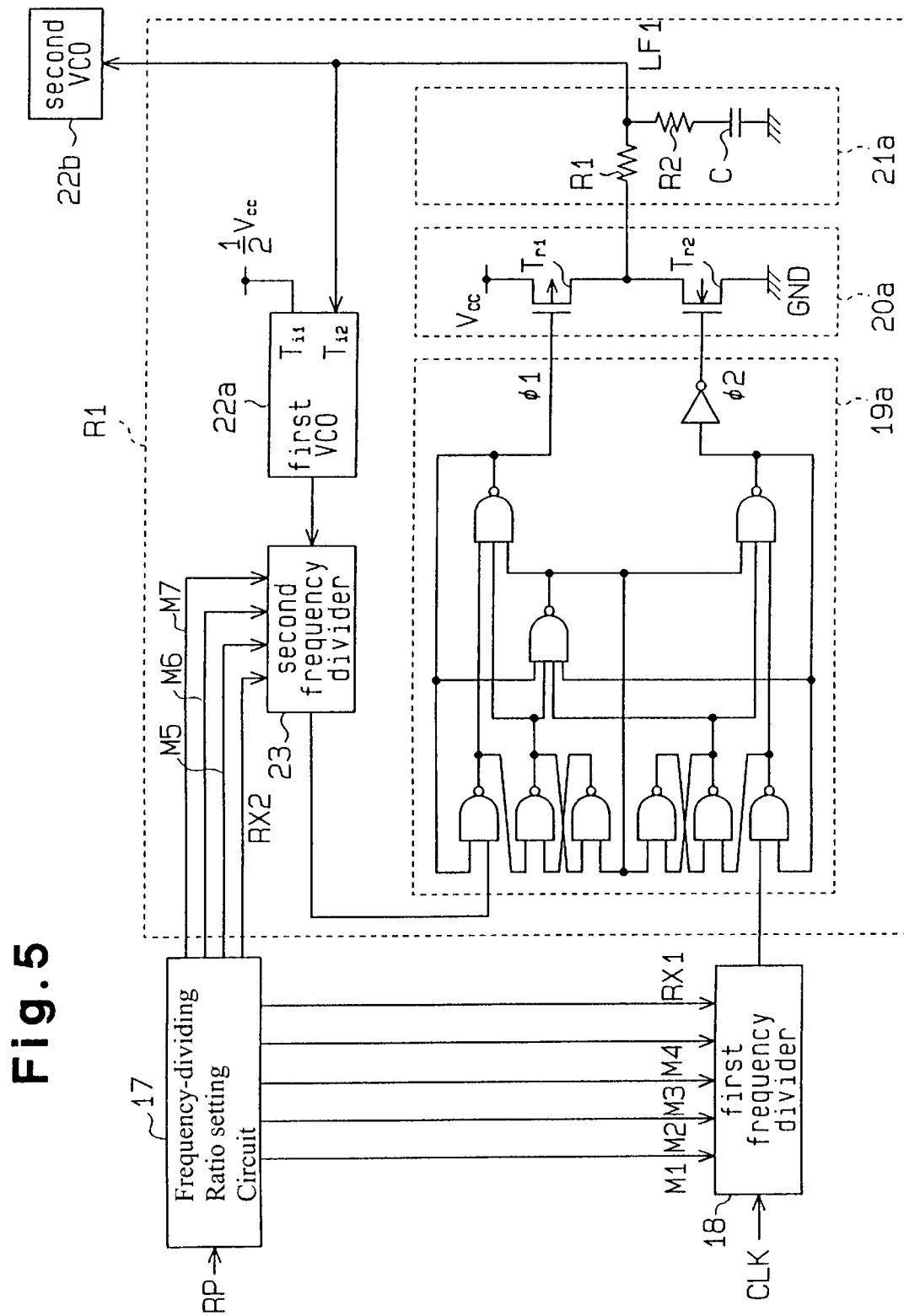

As shown in FIG. 5, a frequency-dividing ratio setting circuit 17 provides four frequency-dividing ratio setting signals M1, M2, M3, M4 and a reset signal RX1 to the first frequency divider 18 and also provides three frequency-dividing ratio setting signals M5, M6, M7 and a reset signal RX2 to the second frequency divider 23. The first phase comparator 19a receives the second frequency dividing signal from the second frequency divider 23 and the first frequency-dividing signal from the first frequency-divider 18, and outputs a first and a second comparator output signals Φ1 and Φ2 in accordance with the phase difference between both received signals.

When the phase of the first frequency-dividing signal leads the phase of the second frequency-dividing signal, the phase comparator 19a provides both the first and the second comparator output signals Φ1 and Φ2 high. When the phase of the first frequency-dividing signal lags behind the phase of the second frequency-dividing signal, the phase comparator 19a provides both the first and the second comparator output signals Φ1 and Φ2 low. When the phases of the first and second frequency-dividing signals Φ1 and Φ2 match, the phase comparator 19a provides the first comparator output signal Φ1 high and the second comparator output signal Φ2 low.

The first charge pump 20a has a P channel MOS transistor Tr1 and an N channel MOS transistor Tr2 connected in series between the power supply $V_{CC}$ and ground GND. The transistor Tr1 has a gate for receiving the first comparator output signal Φ1. The transistor Tr2 has a gate for receiving the second comparator output signal Φ2. Moreover, each of the transistors Tr1 and Tr2 has a drain for providing the analog output voltage signal from the first charge pump 20a to the first loop filter 21a.

When both the first and the second comparator output signals Φ1 and Φ2 become low, the transistor Tr1 is turned on and the transistor Tr2 is turned off. Then a current flows to the first loop filter 21a from the power supply $V_{CC}$. As a result, the voltage at the input terminal of the loop filter 21a increases. When both the first and the second comparator output signals Φ1 and Φ2 become high, the transistor Tr1 is turned off and the transistor Tr2 is turned on. Then a current flows to the ground GND from the loop filter 21a. As a result, the voltage at the input terminal of the loop filter 21a decreases.

The first loop filter 21a serves as a low-pass filter and it comprises resistors R1 and R2 and a capacitor C. The loop filter 21a removes the high-frequency component from the analog output voltage signal from the first charge pump 20a and generates a filtered analog voltage signal LF1. Then the loop filter 21a provides the filtered analog voltage signal LF1 to both VCOs 22a and 22b.

Figure 6:
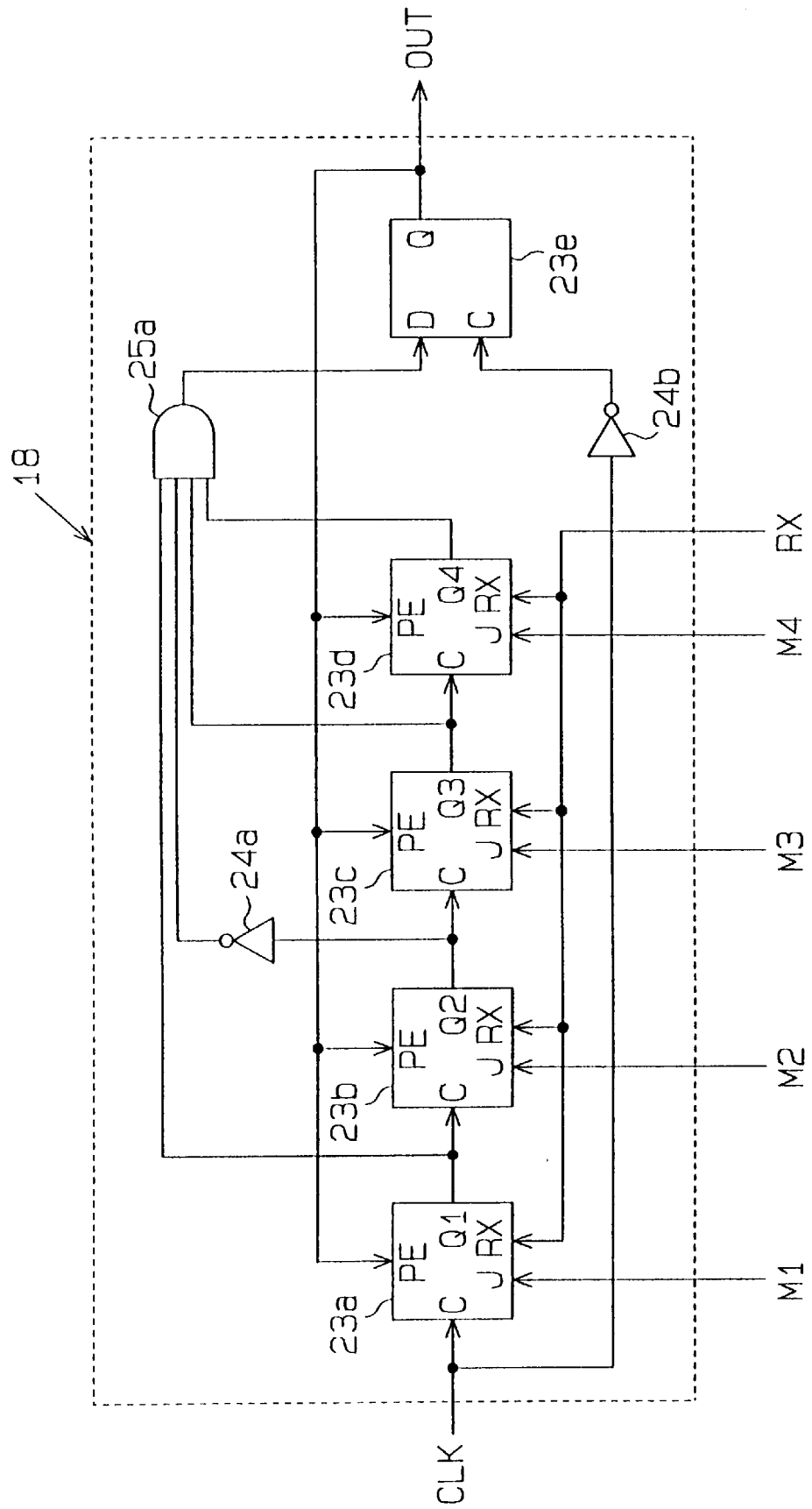

FIG. 6 is a block diagram of the first frequency divider 18. The first frequency divider 18 includes four stages of flip-flop circuits 23a to 23d connected in series, inverters 24a and 24b, an AND gate 25a and a flip-flop circuit 23e at the output stage.

The first-stage flip-flop circuit 23a has a clock terminal C for receiving a clock signal CLK. Each of the flip-flop circuits 23a to 23d has an output terminals Q1 to Q4 to provide an output signal. The AND circuit 25 has a first input terminal connected to the output terminal Q1, a second input terminal connected to the output terminal Q2 via inverter circuit 24, third and fourth input terminal connected to the output terminal Q3, Q4 respectively, and an output terminal. Each of the second, third, and fourth stage flip-flop circuits 23b, 23c and 23d has a clock terminal C to receive output signals provided from the previous flip-flop circuit.

The output-stage flip-flop circuit 23e has a clock terminal C for receiving the clock signal CLK via the inverter 24b, a data terminal D connected to the output terminal of the AND circuit 25a and an output terminal Q. The flip-flop circuit 23e provides a data signal from the AND circuit 25a as an output signal OUT on the output terminal Q at the timing of the falling from high to low of the clock signal C.

Each of the flip-flop circuits 23a to 23d has a first input terminal PE connected to the output terminal Q of the flip-flop circuit 23e. Further, each of the flip-flop circuits 23a to 23d has a second input terminal J for receiving the frequency-dividing ratio setting signals M1 to M4 provided from the frequency-dividing ratio setting circuit 17 and a reset terminal RX for receiving the reset signal RX1.

Figure 7:
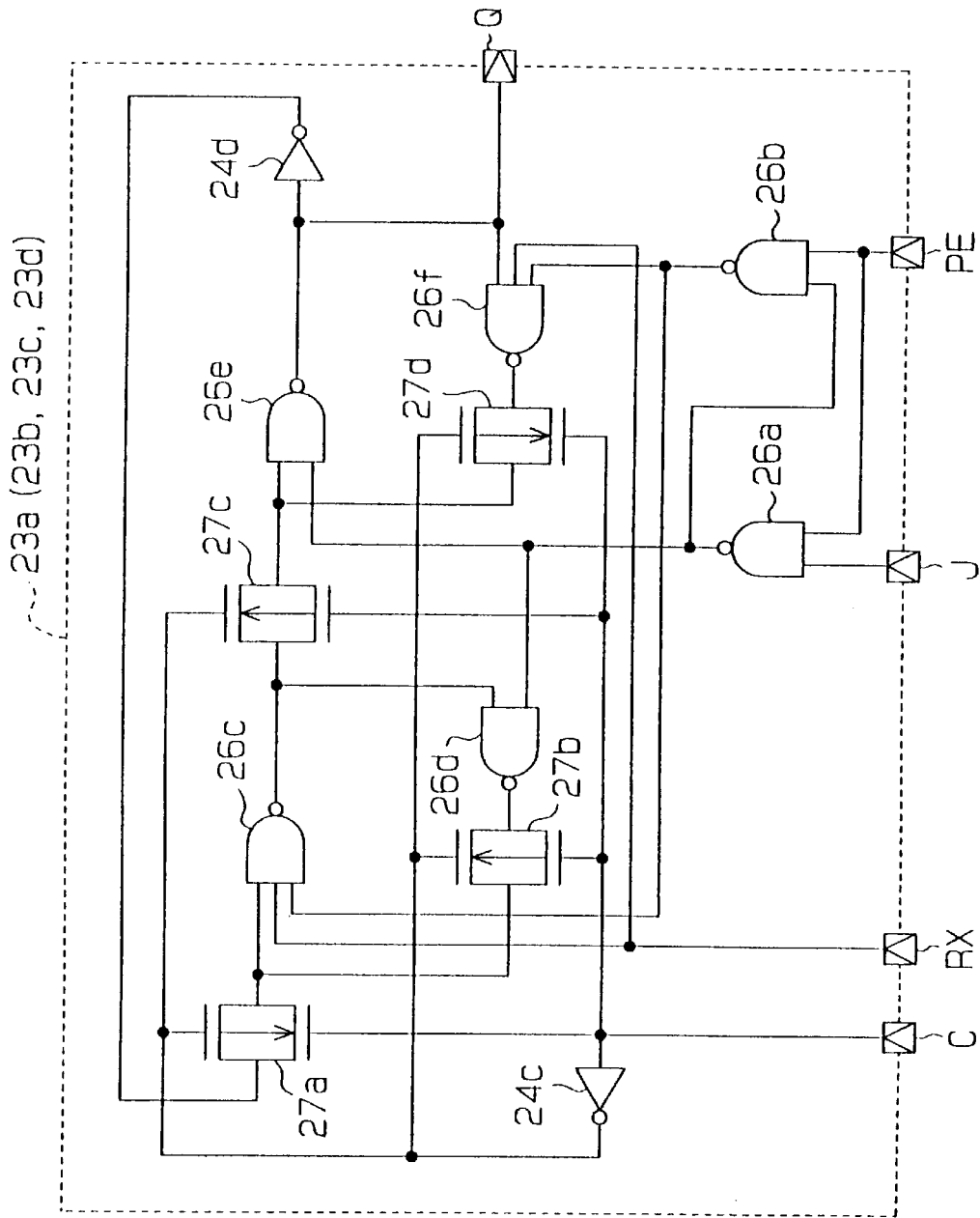

FIG. 7 is a block diagram illustrating one of the four flip-flop circuits 23a to 23d that have the same structure. The illustrated flip-flop circuit includes six NAND gates 26a to 26f, two inverters 24c and 24d, and four transfer gates 27a to 27d. A pair of transfer gates 27a and 27c and the other pair of transfer gates 27b and 27d are alternately opened and closed in response to the clock signal C.

Figure 8:
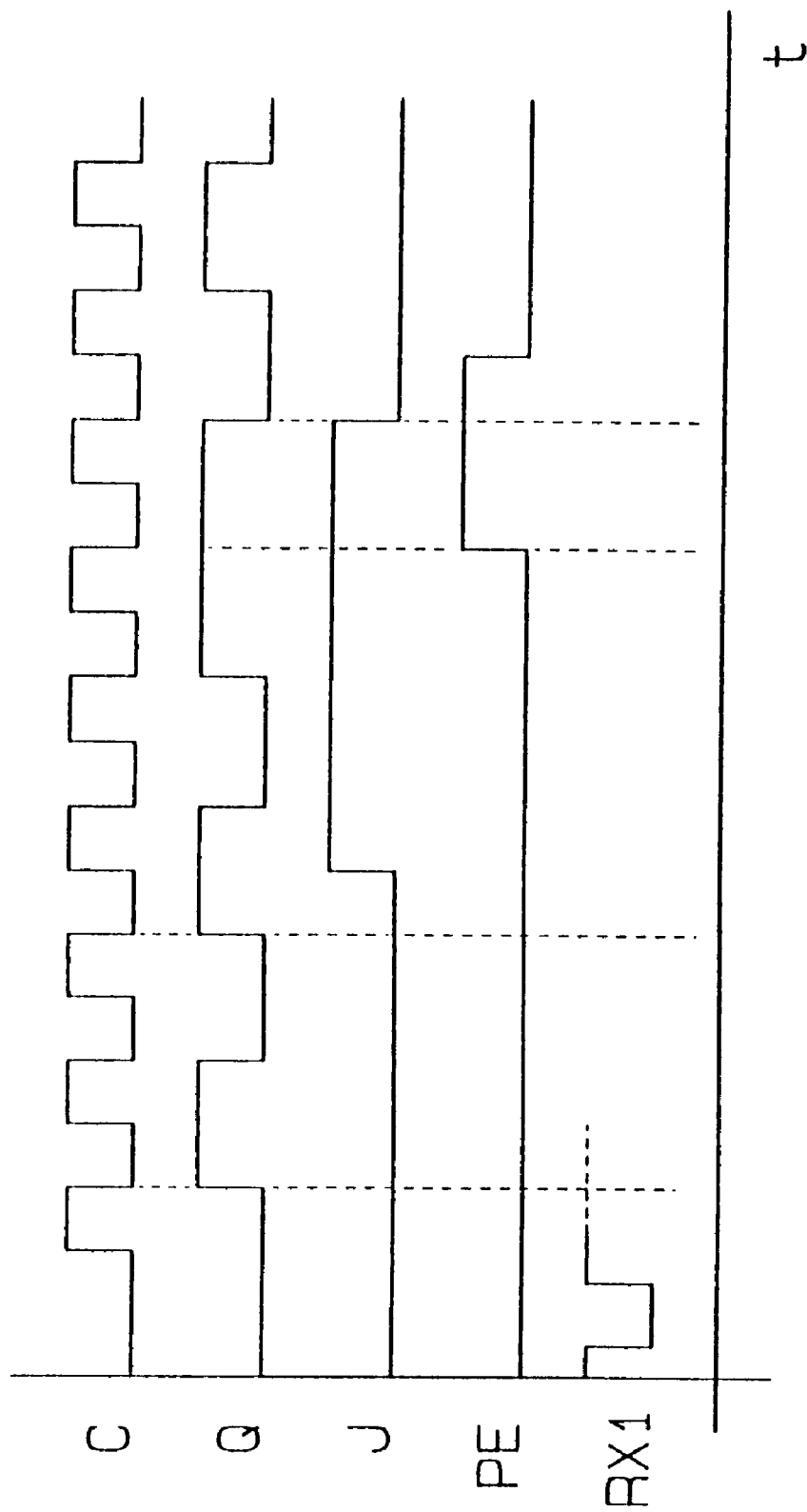

FIG. 8 presents a timing chart for explaining the operation of the flip-flop circuits 23a to 23d. When the reset signal RX1 falls from a high (H) level to a low (L) level, the output signal from the output terminal Q is reset to a low (L) level. In this case, if the first input terminal PE is at a low (L) level, the clock signal C frequency-divided by two is provided as the output signal from the output terminal Q, and if the first input terminal PE is at a high (H) level, an input signal to the second input terminal J is provided from the output terminal Q.

Figure 9:
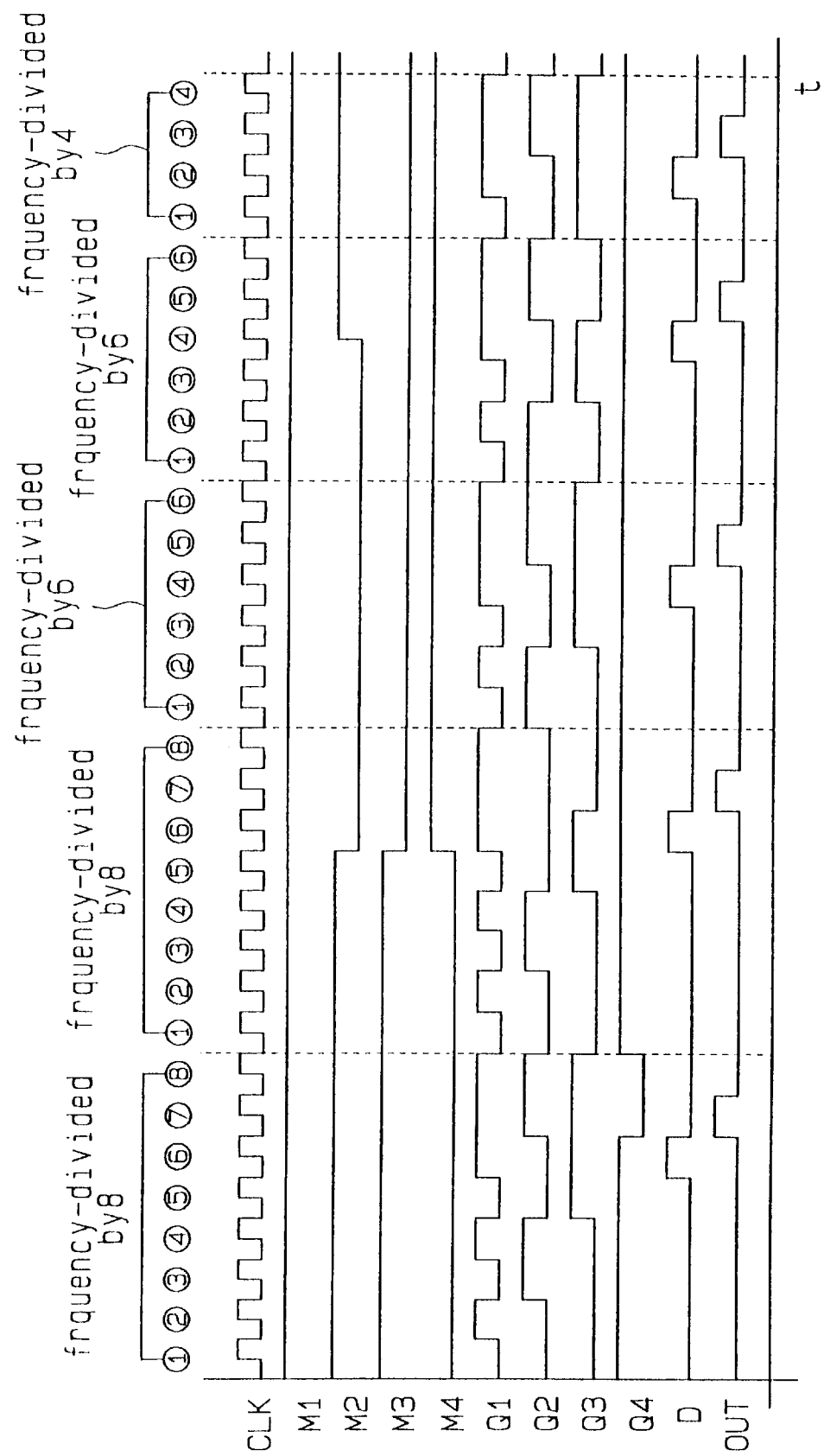

FIG. 9 presents a timing chart for explaining the operation of the first frequency divider 18. As illustrated in this diagram, the frequency-dividing ratio of the first frequency divider 18 can be altered by properly switching the frequency-dividing ratio setting signals M1 to M4.

The second frequency divider 23 has the structure of the first frequency divider 18 from which the flip-flop circuit 23d is eliminated. The second frequency divider 23 changes the frequency-dividing ratio in accordance with the frequency-dividing ratio setting signals M5 to M7 output from the frequency-dividing ratio setting circuit 17.

Figure 10:
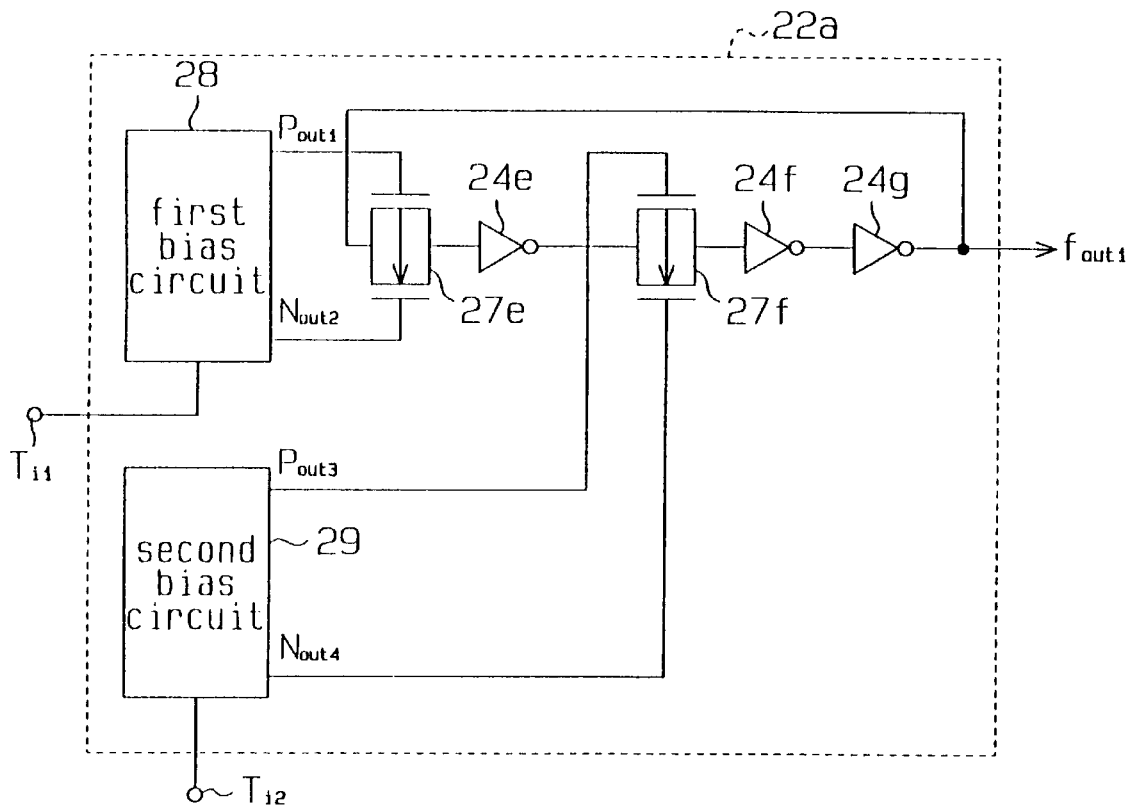

FIG. 10 shows the structure of the first VCO 22a. The second VCO 22b has the same structure as the first VCO 22a. The VCO 22a has an odd-numbered stages of inverters 24e to 24g connected in a loop, a first transfer gate 27e connected between the final-stage inverter circuit 24g and the first-stage inverter circuit 24e and a second transfer gate 27f connected between the first-stage inverter 24e and the second-stage inverter 24f. The VCO 22a further includes a first bias circuit 28 and a second bias circuit 29.

The first bias circuit 28 has the first input terminal Ti1 for receiving an input signal (constant voltage signal) and generating first and second bias voltage signals $P_{out1}$ and $N_{out2}$ in response to the input signal. The first and second bias voltage signals $P_{out1}$ and $N_{out2}$ are provided to the first transfer gate 27e. The second bias circuit 29 has the input terminal $T_{i2}$ for receiving an input signal (filtered analog voltage signal) and generating third and a fourth bias voltage signals $P_{out3}$ and $N_{out4}$ in response to the input signal. The third and fourth bias voltage signals $P_{out3}$ and $N_{out4}$ are provided to the second transfer gate 27.

The first transfer gate 27e has two gates for receiving first and second bias voltage signals $P_{out1}$ and $N_{out2}$ from the first bias circuit 28. The second transfer gate 27f has two gates for receiving the third and fourth bias voltage signals $P_{out3}$ and $N_{out1}$ from the second bias circuit 29.

When the first and the second transfer gates 27e and 27f are activated, the inverters 24e to 24g oscillate to output the oscillator output signal $f_{out1}$. The frequency of the oscillator output signal $f_{out1}$ becomes lower in accordance with the increase of the resistances of the first and second transfer gates 27e and 27f, and becomes higher in accordance with the decrease of those resistances.

Figure 11:
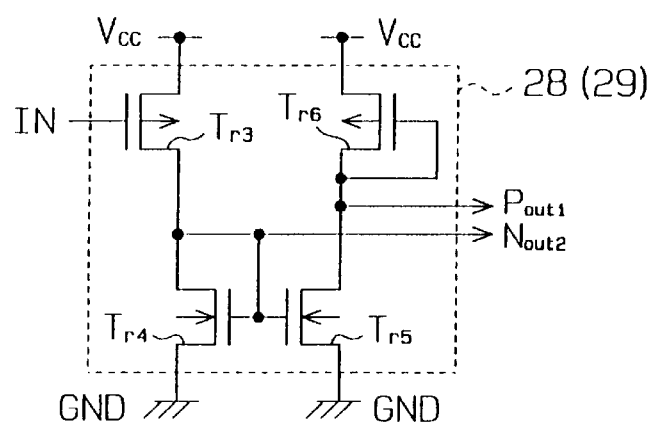

FIG. 11 shows the specific structure of the bias circuit. The first and second bias circuits 28 and 29 have the same circuit structure, and both have two P channel MOS transistors Tr3, Tr6 and two N channel MOS transistor Tr4, Tr5. However, the size of the P channel transistors Tr3 and Tr6 of the first bias circuit 28 differ from the P channel transistors Tr3 and Tr6 of the second bias circuit 29.

The P channel MOS transistor Tr3 has a gate for receiving the input signal IN, a source connected to the power supply $V_{CC}$ and a drain. The N channel MOS transistor Tr4 has a drain connected to the drain of the transistor Tr3, a source connected to the ground GND and a gate connected to its drain. The second bias voltage signal $N_{out2}$ is output from the drains of the transistors Tr3, Tr4. The transistor Tr5 has a source connected to the ground GND, a gate connected to the drain of the transistor Tr4 and a drain. The transistor Tr6 has a drain connected to the drain of the transistor Tr5, a gate connected to its drain and a source connected to the power supply $V_{CC}$. The first bias output voltage $P_{out1}$ is output from the drains of the transistors Tr5 and Tr6.

The first and second transfer gates 27e and 27f have a P channel MOS transistor and a N channel MOS transistor, respectively. The P channel MOS transistors have a gate for receiving the first and the third bias voltage signals $P_{out1}$ and $P_{out3}$ respectively. The N channel MOS transistors have a gate for receiving the second and the fourth bias voltage signals $N_{out2}$ and $N_{out4}$ respectively.

In the thus constituted bias circuit 28, when the potential of the input signal IN is almost as high as the potential of the power supply Vcc, the potential of the second bias voltage signal $N_{out2}$ falls and the potential of the first bias voltage signal $P_{out1}$ rises. On the other hand, when the potential of the input signal IN decreases, increasing the potential difference between itself and the power supply $V_{CC}$, the potential of the second bias voltage $N_{out2}$ rises and the potential of the first bias voltage $P_{out1}$ falls. Consequently, when the input signal IN has a low potential, the resistances of the first and second transfer gates 27e and 27f decrease. When the input signal has a high potential, the resistances of the first and second transfer gates 27e and 27f increase.

The transistors Tr3 and Tr6 of the second bias circuit 29 are designed to have a greater size than the size of the transistors Tr3 and Tr6 of the first bias circuit 28. Therefore, the amplitude of the difference of potential between the third and the fourth bias output voltages $N_{out3}$ and $P_{out4}$ which alter in accordance with the input signal is greater than the amplitude of the difference of potential between the first and the second bias voltage signal $N_{out1}$ and $P_{out2}$. This allows the first VCO 22a to operate with a high gain in response to the analog voltage signal provided to the second terminal $T_{i2}$.

Figure 12:
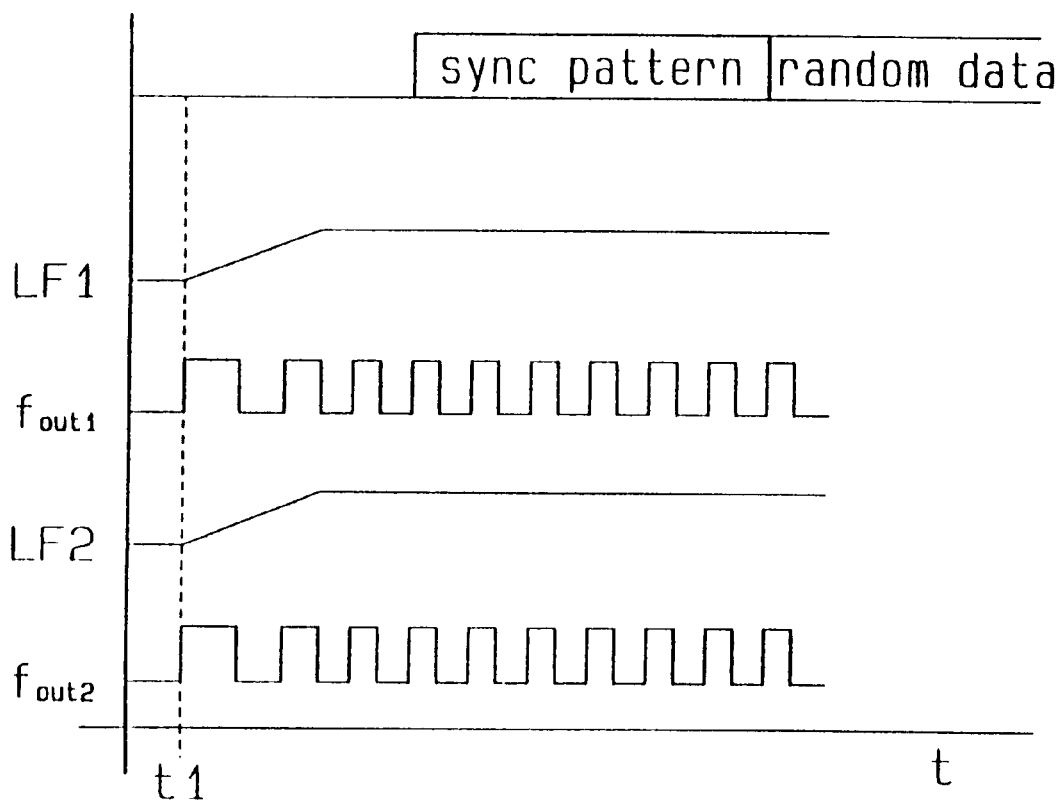

FIG. 12 presents a timing chart for explaining the operation of the phase synchronizer 16.

In the data reading operation, the controller 13 outputs the read position signal RP to the magnetic disk driver 11 and to the frequency-dividing ratio setting circuit 17 to change the data reading position on the magnetic disk 100. The reading head 14 is shifted to the changed reading position.

When the read position signal RP is input to the frequency-dividing ratio setting circuit 17 at time t1 shown in FIG. 12, this circuit 17 selects one of the frequency-dividing ratio setting signals M5 to M7 in response to the read position signal RP then provides this signal to the second frequency divider 23 of the phase synchronizer 16. In response to the selected one of the frequency-dividing ratio setting signals M5 to M7, the second frequency divider 23 sets the frequency-dividing ratio corresponding to the reading position.

In accordance with a change in the frequency-dividing ratio of the second frequency divider 23, the first feedback circuit R1 operates to synchronize the oscillator output signal $f_{out1}$ from the first VCO 22a with the frequency of the read signal read from the reading position.

At this time, the first VCO 22a operates with a high gain in response to the analog voltage signal LF1 provided to the second input terminal $T_{out2}$ from the first loop filter 21a. Consequently, the oscillator output signal $f_{out1}$ of the first VCO 22a is promptly synchronized with the desired frequency set by the changed frequency-dividing ratio.

The second VCO 22b of the second feedback circuit R2 operates with a high gain in response to the analog voltage signal LF1 provided to the second input terminal $T_{i2}$ from the first loop filter 21a. At this time, the analog voltage signal LF2 from the second loop filter 21b is provided to the first input terminal $T_{i1}$ of the second VCO 22b. Then, the frequency of the output signal $f_{out2}$ changes in a larger degree with respect to the analog voltage signal LF1 than with respect to the analog voltage signal LF2. Consequently, the frequency of the oscillator output signal $f_{out2}$ from the second VCO 22b quickly matches with the frequency of the output signal $f_{out1}$.

When the shifting of the reading head 14 to the data reading position is completed and the reading operation starts, the second feedback circuit R2 receives a sync pattern initially contained in the read signal $f_{in}$.

Since the first VCO 22a provides the stable oscillator output signal $f_{out1}$ at this time, the first loop filter 21a provides the analog voltage signal LF1 with a fixed potential to the first and second VCO 22a and 22b. Therefore, the second VCO 22b operates in response to the analog voltage signal LF2 provided to the first input terminal $T_{i1}$ from the second loop filter 21b.

The second feedback circuit R2 operates in such a way as to synchronize the phase of the oscillator output signal $f_{out2}$ with the phase of the read signal $f_{in}$. As the function of the first bias circuit 28 allows the second VCO 22b to operate with a low gain at this time, the stable oscillator output signal $f_{out2}$ is provided. As a result, the decoder 16a reproduces read data from random data following the sync pattern, in response to the oscillator output signal $f_{out2}$.

In altering the data reading position on the magnetic disk, the phase synchronizer 16 in this embodiment changes the frequency-dividing ratio of the second frequency divider 23 in association with the read position signal RP before receiving the read signal $f_{in}$ from the reading position, thereby promptly synchronizing the frequency of the oscillator output signal $f_{out2}$. Then, in response to the read signal $f_{in}$, the phase synchronizer 16 can stably synchronize the phase of the oscillator output signal $f_{out2}$ with the phase of the read signal $f_{in}$. In other words, the phase synchronizer 16 can improve the speed of synchronizing the oscillator output signal $f_{out2}$ with the read signal $f_{in}$ and can stabilize the oscillator output signal $f_{out2}$.

As the sync pattern recorded on the magnetic disk 100 is used for the approximate phase synchronization, shortening its data length does not cause any hindrance. It is therefore possible to improve the data recording density by previously shortening the data length of the sync pattern at the time of writing data on the magnetic disk 100.

SECOND EMBODIMENT

Figure 13:
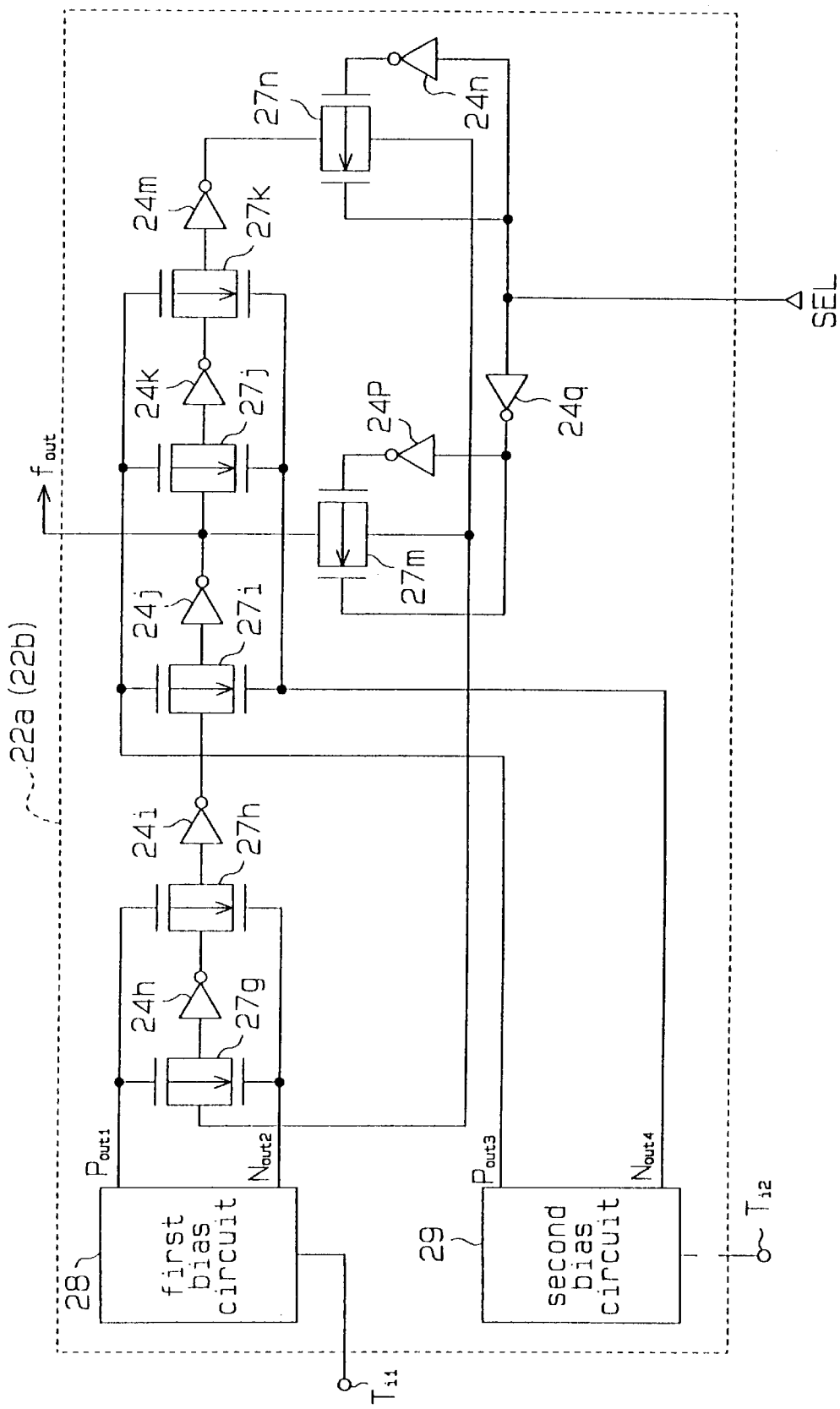
FIG. 13 is a circuit diagram for explaining a VCO according to a second embodiment of this invention.

FIG. 13 shows a modification of the VCOs 22a and 22b of the first embodiment. The first and second bias circuits 28 and 29 have the same structures as those of the first embodiment.

The first VCO 22a has the first and second bias circuits 28 and 29, seven transfer gates 27g, 27h, 27i, 27j, 27k, 27m, 27n and eight inverter circuits 24h, 24i, 24j, 24k, 24m, 24n, 24p, 24q.

The first inverter circuit 24h has an output terminal connected to the input terminal of the inverter circuit 24i via the transfer gate 27h. The second inverter circuit 24i has an output terminal connected to the input terminal of the inverter circuit 24j via the transfer gate 27i. The third inverter circuit 24j has an output terminal connected to the input terminal of the inverter circuit 24k via the transfer gate 27j. The fourth inverter circuit 24k has an output terminal connected to the input terminal of the inverter circuit 24m via the transfer gate 27k. The fifth inverter circuit 24m has an output terminal connected to the input terminal of the inverter circuit 24h via the transfer gates 27n and 27g. The output terminal of the third inverter circuit 24j is also connected to the input terminal of the inverter circuit 24h via transfer gates 27m and 27g.

The first bias circuit 28 drives the two transfer gates 27g and 27h, while the second bias circuit 29 drives the three transfer gates 27i to 27k.

The controller 13 provides a select signal SEL to the first and second VCOs 22a and 22b. An N channel MOS transistor included in the transfer gate 27m has a gate for receiving the select signal SEL inverted by the sixth inverter circuit 24q.

The P channel MOS transistor included in the transfer gate 27m has a gate for receiving the select signal SEL passed through the inverter 24q and 24p.

The N channel MOS transistor included in the transfer gate 27n has a gate for receiving the select signal SEL. The P channel MOS transistor included in the transfer gate 27n has a gate for receiving the select signal SEL inverted by the eighth inverter circuit 24n.

Therefore, when the select signal SEL becomes high, the transfer gate 27m is turned off and the transfer gate 27n is turned on. On the other hand, when the select signal SEL becomes low, the transfer gate 27m is turned on and the transfer gate 27n is turned off.

When the select signal SEL has a low (L) level, the three stages of inverters 24h to 24j in the thus constituted VCO are connected in a loop. The first bias circuit 28 controls the resistances of the transfer gates 27g and 27h. The second bias circuit 29 controls the resistance of the transfer gate 27i. Therefore, the first and the second VCOs 22a and 22b can control the frequency of the oscillator output signal $f_{out}$ in accordance with the oscillation frequency determined by the three stages of inverters 24h to 24j.

When the select signal SEL has a high (H) level, the five stages of inverters 24h to 24m in the VCO are connected in a loop. The first bias circuit 28 controls the resistances of the transfer gates 27g and 27h. The second bias circuit 29 controls the resistances of the three transfer gates 27i to 27k. Therefore, the first and second VCOs 22a and 22b can control the frequency of the oscillator output signal $f_{out}$ in accordance with the oscillation frequency determined by the five stages of inverters 24h to 24m.

Since a plurality of transfer gates operate in parallel at this time, the range of the adjustment of the resistance by the transfer gates increases. Therefore, changing the number of stages of the inverters to be connected in a loop and increasing the range of the adjustment of the resistance by the transfer gates can widen the frequency range of the oscillator output signal provided by the VCO.

THIRD EMBODIMENT

Figure 14:
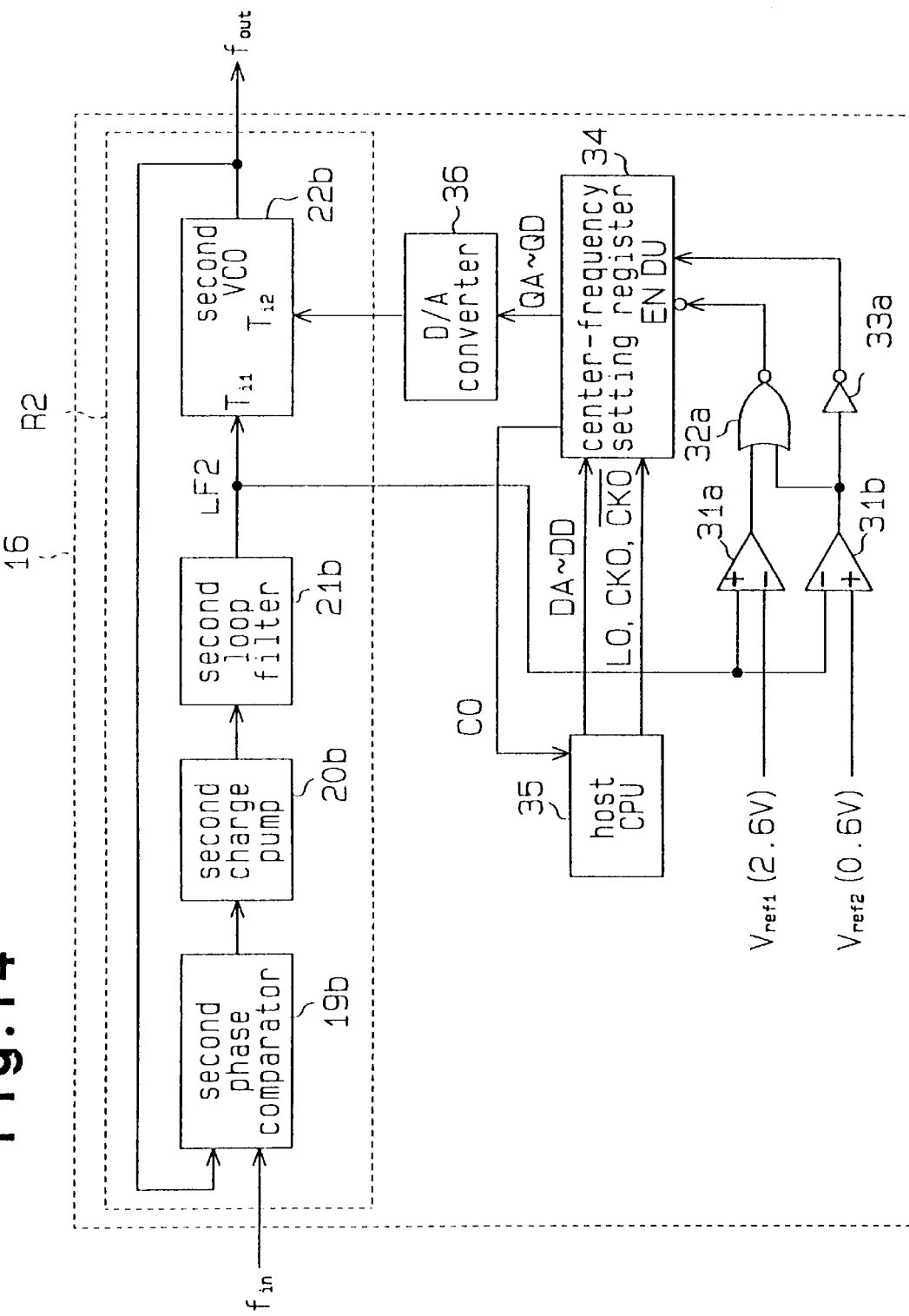

FIG. 14 shows a modification of the phase synchronizer 16. The phase synchronizer 16 has the second feedback circuit R2 with the same structure as that of the first embodiment, a first and a second comparator 31a and 31b, a NOR circuit 32a, an inverter circuit 33a, a center-frequency setting register 34, a host CPU 35 and a D/A converter 36.

The first comparator 31a has a non-inverting input terminal for receiving an analog voltage signal LF2 and an inverting input terminal to which a first reference voltage $V_{ref1}$ of 2.6 V, for example, is applied. The second comparator 31b has an inverting input terminal for receiving an analog voltage signal LF2 and non-inverting input terminal to which a second reference voltage $V_{ref2}$ of 0.6 V, for example, is applied. The first comparator 31a therefore outputs a high (H) level signal when the analog signal LF2 becomes equal to or greater than 2.6 V. The second comparator 31b outputs a high level signal when the analog voltage signal LF2 becomes equal to or smaller than 0.6 V.

A NOR circuit 32a has a first input terminal for receiving the output signal from the first comparator 31a, a second input terminal for receiving the output signal from the second comparator 31b and an output terminal providing a active low enable signal EN to the center-frequency setting resister 34.

The inverter 33a receives the output signal from the second comparator 31b and provides a count data setting signal DU to the center-frequency setting register 34.

The center-frequency setting register 34 stores digital signals DA to DD of multiple bits output from a host CPU 35 for setting the center frequency of the oscillator output signal $f_{out}$ of the second VCO 22b. The host CPU 35 provides a load signal LO and clock signal CKO and /CKO to the center-frequency setting register 34.

When the data setting signal DU rises to a high (H) level with the enable signal EN having a low (L) level, the register 34 counts up the stored data by "1". When the data setting signal DU falls to an L level with the enable signal EN having the low (L) level, the register 34 counts down the stored data by "1".

The register 34 provides the stored data signal (4-bit output signals QA to QD) to a D/A converter 36. The D/A converter 36 converts the received data to an analog value, which is in turn provided to the input terminal $T_{i2}$ of the second VCO 22b.

Figure 15:
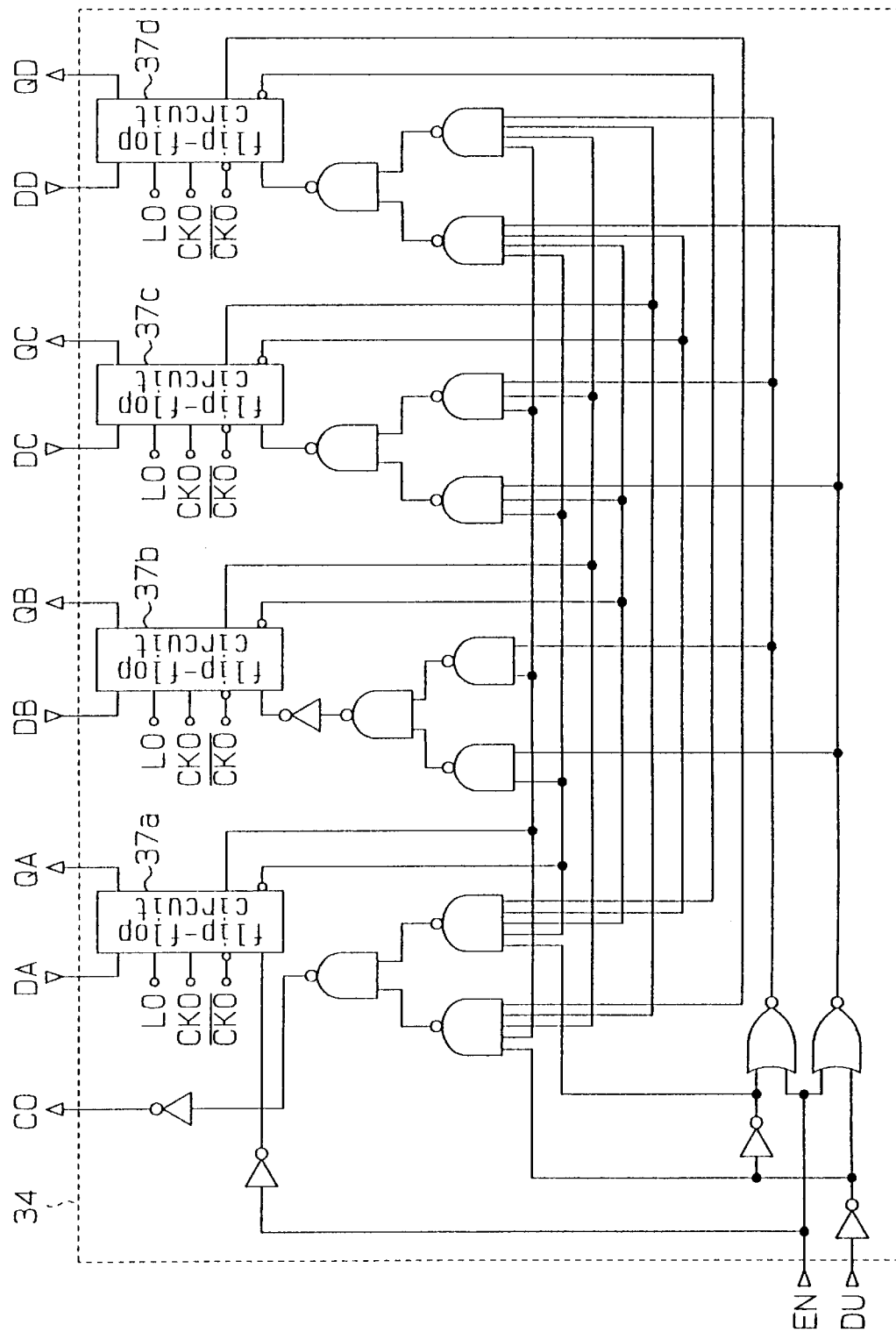

FIG. 15 shows the specific structure of the center-frequency setting register 34. The register 34 is an up/down counter with a loading function, and includes four flip-flop circuits 37a to 37d and multiple logic circuits.

The individual flip-flop circuits 37a to 37d respectively receive set data signal DA, DB, DC and DD from the host CPU 35. In response to the enable signal EN and the data setting signal DU, the individual flip-flop circuits 37a to 37d perform a count-up operation or a count-down operation. The flip-flop circuits 37a to 37d output the 4-bit signals QA to QD as stored data, respectively.

The flip-flop circuits 37a to 37d operate in response to a load signal LO and clock signal CKO and /CKO provided from the host CPU 35.

The center-frequency setting register 34 outputs a carry-out signal CO to the host CPU 35 when a count-up by "1" is executed after the output signals QA to QD of the flip-flop circuits 37a to 37d all become "1". The host CPU 35 sets the set data DA to DD again in response to the carry-out signal CO.

Figure 16:
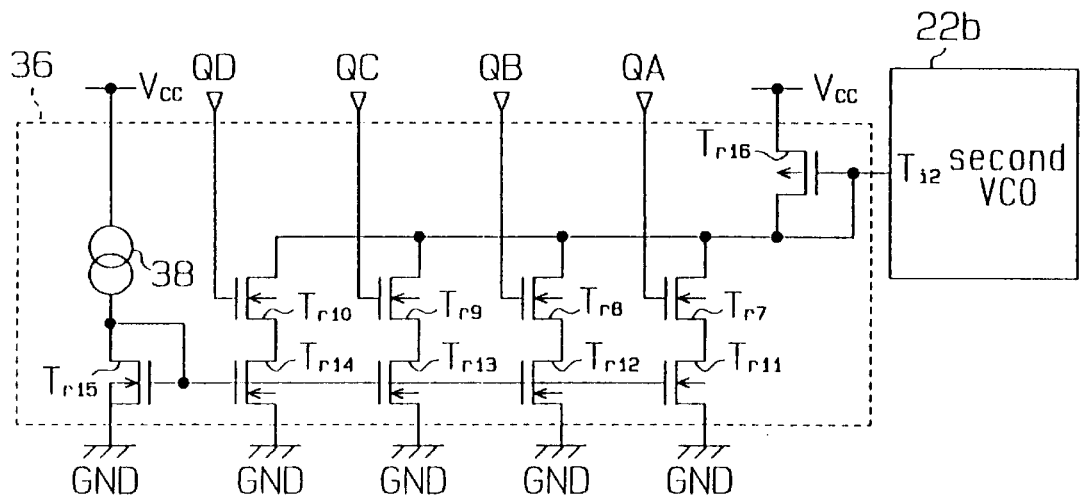

FIG. 16 shows the specific structure of the D/A converter 36. The D/A converter 36 has nine N channel MOS transistors Tr7 to Tr15, a P channel MOS transistor Tr16 and a current source 38. The first to fourth N channel MOS transistors Tr7 to Tr10 have a gate for receiving data output signals QA to QD provided from the register 34 and a source connected to the ground GND via the fifth to eighth N channel MOS transistors Tr11 to Tr14 respectively. The first to fourth transistors Tr7 to Tr10 operate as switches which are turned on or off in response to the data output signals QA to QD from the register 34.

The fifth to eighth transistors Tr11 to Tr14 have a gate connected to the gate and the drain of the ninth N channel MOS transistor Tr15. Each of the fifth to eighth transistors Tr11 to Tr14 and ninth transistor Tr15 constitute a current mirror circuit. The ninth N channel MOS transistor Tr15 has a source connected to the ground GND and a drain connected to the power supply Vcc via the current source 38.

The first to fourth transistors Tr7 to Tr10 have a drain connected to the drain and the gate of the P channel MOS transistor Tr16. The transistor Tr16 has a source connected to the power supply $V_{CC}$ and a gate connected to the input terminal $T_{i2}$ of the VCO 22b.

The fifth and ninth transistors Tr11 and Tr15 have the same size. The size ratio of the fifth to eighth transistors Tr11 to Tr14 is 1:2:4:8. Therefore, the ratio of the current driving performances of the fifth to eighth transistors Tr11 to Tr14 which, together with the ninth transistor Tr15, constitute the current mirror circuit is 1:2:4:8. When the first to fourth transistors Tr7 to Tr10 are turned on or off in response to the 4-bit digital input signals QA to QD, the D/A converter 36 provides an analog voltage output signal obtained by converting the digital input signals QA to QD to an analog current to the input terminal $T_{i2}$ of the second VCO 22b. The comparators 31a and 31b, the NOR gate 32a, the inverter 33a, the center-frequency setting register 34, the host CPU 35 and the D/A converter 36 together constitute a synchronization accelerating circuit.

A description will be now given of the case where the phase synchronizer 16 with the above-described structure is used in the aforementioned data reproducing apparatus. The center-frequency setting register 34 receives set data DA to DD that are previously set from the host CPU 35. The D/A converter 36 provides an analog output voltage signal according to the set data signals DA to DD to the second input terminal $T_{i2}$ of the second VCO 22b. The second VCO 22b operates in response to the analog output signal from the D/A converter 36 to set the center operation frequency, for example, 100 MHz as indicated by the segments B on the line graph of an operational characteristic in FIG. 17.

When the data reading position on the magnetic disk is changed and the frequency of the read signal $f_{in}$ changes in the data reading operation, the feedback circuit R2 operates to match the oscillator output signal $f_{out}$ of the VCO 22b with the frequency of the read signal $f_{in}$.

At that time, the second VCO 22b operates with a low gain in response to the filtered analog voltage signal LF2 provided to the first input terminal $T_{i1}$ from the second loop filter 21b. Therefore the slope of the segment B becomes gentle. As a result, the second VCO 22b can provide a stable oscillator output signal $f_{out}$.

On the other hand, the characteristic of the second VCO 22b varies widely. Here it is assumed that the VCO 22b has an operational characteristic as shown by the segment C in FIG. 17 in response to the same set data DA to DD. When the read signal $f_{in}$ of, for example, 100 MHz is input, the oscillator output signal $f_{out}$ of the VCO 22b does not reach 100 MHz even if the analog voltage signal LF2 of the second loop filter 21b exceeds 2.6 V.

When the analog voltage signal LF2 from the loop filter 21b exceeds 2.6 V, the output signal of the first comparator 31a becomes high and the output signal of the second comparator 31b becomes low. As a result, the center-frequency setting register 34 counts up the set data QA to QD by "1".

Consequently, the voltage of the analog output signal to be provided to the second input terminal $T_{i2}$ from the D/A converter 36 decreases, so that the second VCO 22b has the operational characteristic shown by the segment B. The VCO 22b therefore converges the frequency of the oscillator output signal $f_{out}$ to the frequency of the read signal $f_{in}$ which is 100 MHz.

Figure 17:
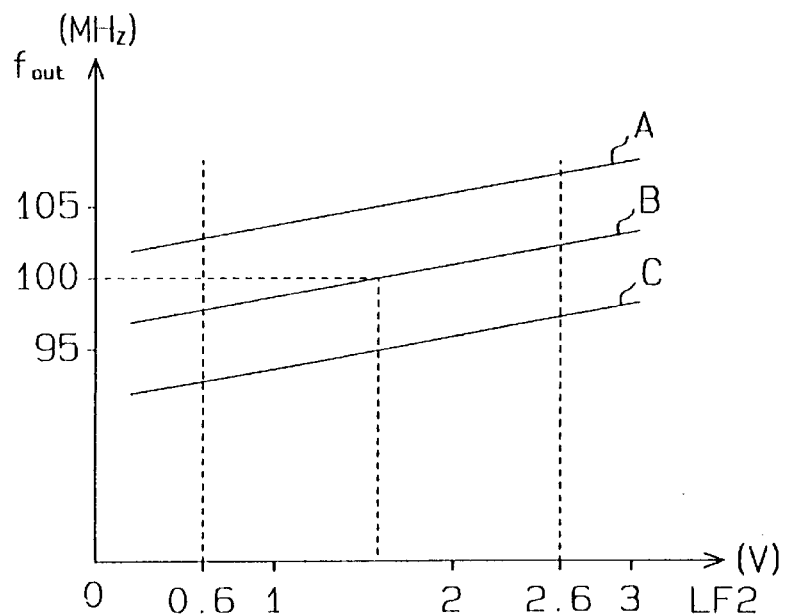

In another case, assume that the VCO 22b has an operational characteristic as shown by the segment A in FIG. 17 based on the same set data DA to DD. When the read signal $f_{in}$ of, for example, 100 MHz is input, the oscillator output signal $f_{out}$ of the VCO 22b does not reach 100 MHz even if the analog voltage signal LF2 of the second loop filter 21b falls below 0.6 V.

When the analog voltage signal LF2 falls below 0.6 V, the output signal of the first comparator 31a becomes low and the output signal of the second comparator 31b becomes high. As a result, the center-frequency setting register 34 counts down the set data QA to AD by "1".

Accordingly, the analog output voltage to be provided to the second input terminal $T_{i2}$ from the D/A converter 36 increases, so that the VCO 22b has the operational characteristic shown by the segment B. The VCO 22b therefore converges the frequency of the oscillator output signal $f_{out}$ to the frequency of the read signal $f_{in}$ which is 100 MHz.

When the frequency of the output signal $f_{out}$ of the VCO 22b does not converge to the frequency of the read signal $f_{in}$ even if the frequency of the read signal $f_{in}$ changes greatly and the output signal LF2 of the loop filter 21b exceeds 2.6 V, or when the frequency of the output signal $f_{out}$ of the VCO 22b does not converge to the frequency of the read signal $f_{in}$ even if the output signal LF2 of the loop filter 21b falls below 0.6 V, the set value of the center-frequency setting register 34 is altered as in the above-described cases. The VCO 22b can therefore converge the frequency of the oscillator output signal $f_{out}$ to the frequency of the read signal $f_{in}$.

According to the phase synchronizer of this embodiment, as discussed above, when the analog voltage signal LF2 from the loop filter 21b varies within the ranges of reference voltages $V_{ref1}$ and $V_{ref2}$, the VCO 22b operates with a low gain to allow the stable oscillator output signal $f_{out}$ to be provided.

When the analog voltage signal LF2 from the loop filter 21b comes out of the ranges of reference voltages $V_{ref1}$ and $V_{ref2}$, the operational characteristic of the VCO 22b can be shifted to a higher or lower frequency range by altering the voltage of the analog output signal to the provide terminal $T_{i2}$ of the VCO 22b. The phase synchronizer of this embodiment can thus provide the stable oscillator output signal $f_{out}$ while securing a wide frequency range.

FOURTH EMBODIMENT

Figure 18:
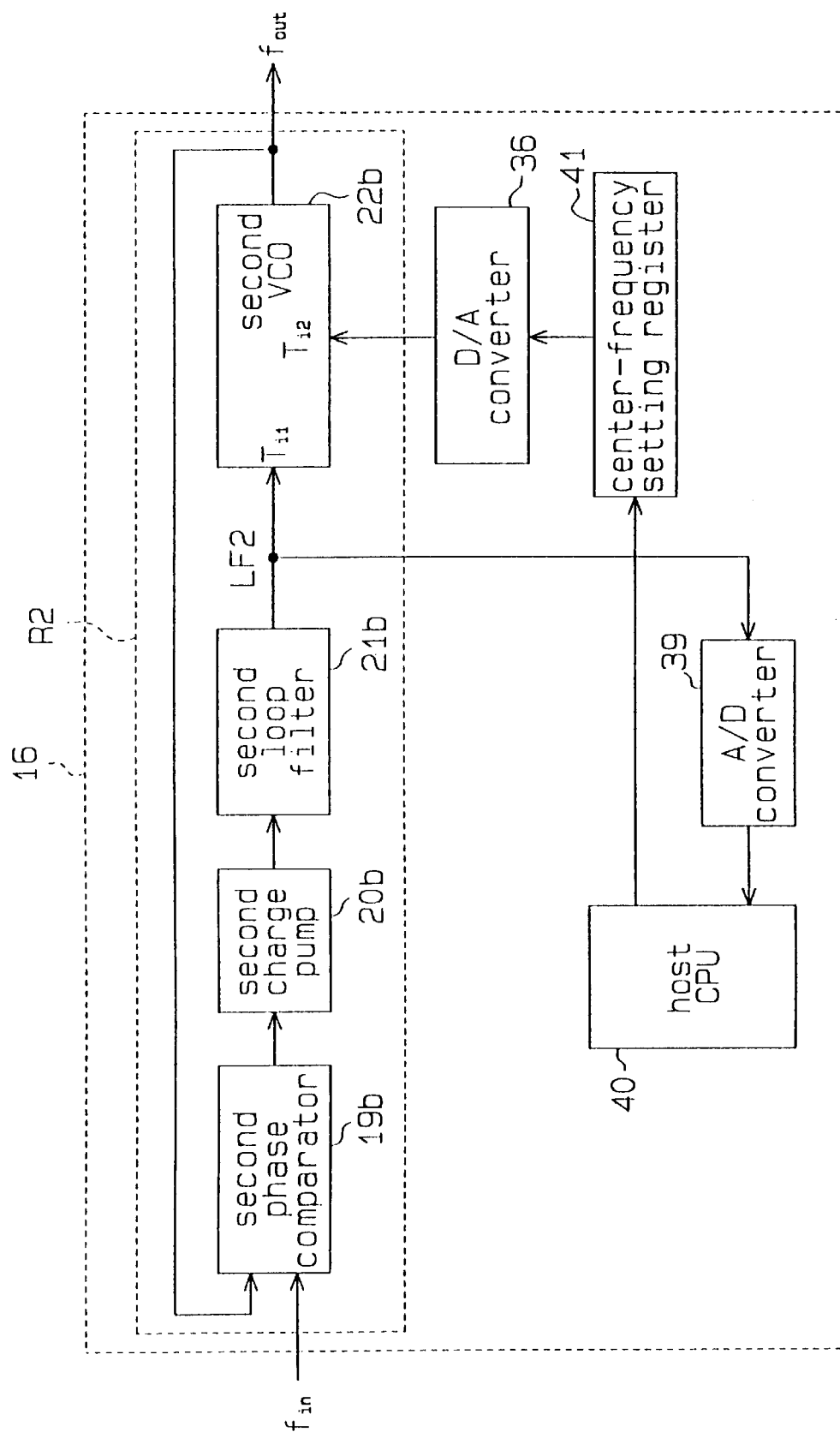

FIG. 18 illustrates a modification of the phase synchronizer 16 according to the third embodiment. Since the phase comparator 19b, charge pump 20b, loop filter 21b, VCO 22b and D/A converter 36 of this embodiment have the same structures as those of the third embodiment, their descriptions are omitted. The phase synchronizer 16 includes an A/D converter 39 instead of the first and second comparators 31a and 31b, the NOR circuit 32a and the inverter 33a.

The A/D converter 39 receives the analog voltage signal LF2 from the loop filter 21b, performs A/D conversion on the signal LF2 and provides the resultant digital signal to a host CPU 40. The host CPU 40 updates the set data value of a center-frequency setting register 41 based on the digital signal provided from the A/D converter 39. This center-frequency setting register 41 does not therefore need a count-up function or a count-down function, but should be simply able to store the output data from the host CPU 40.

Figure 19:
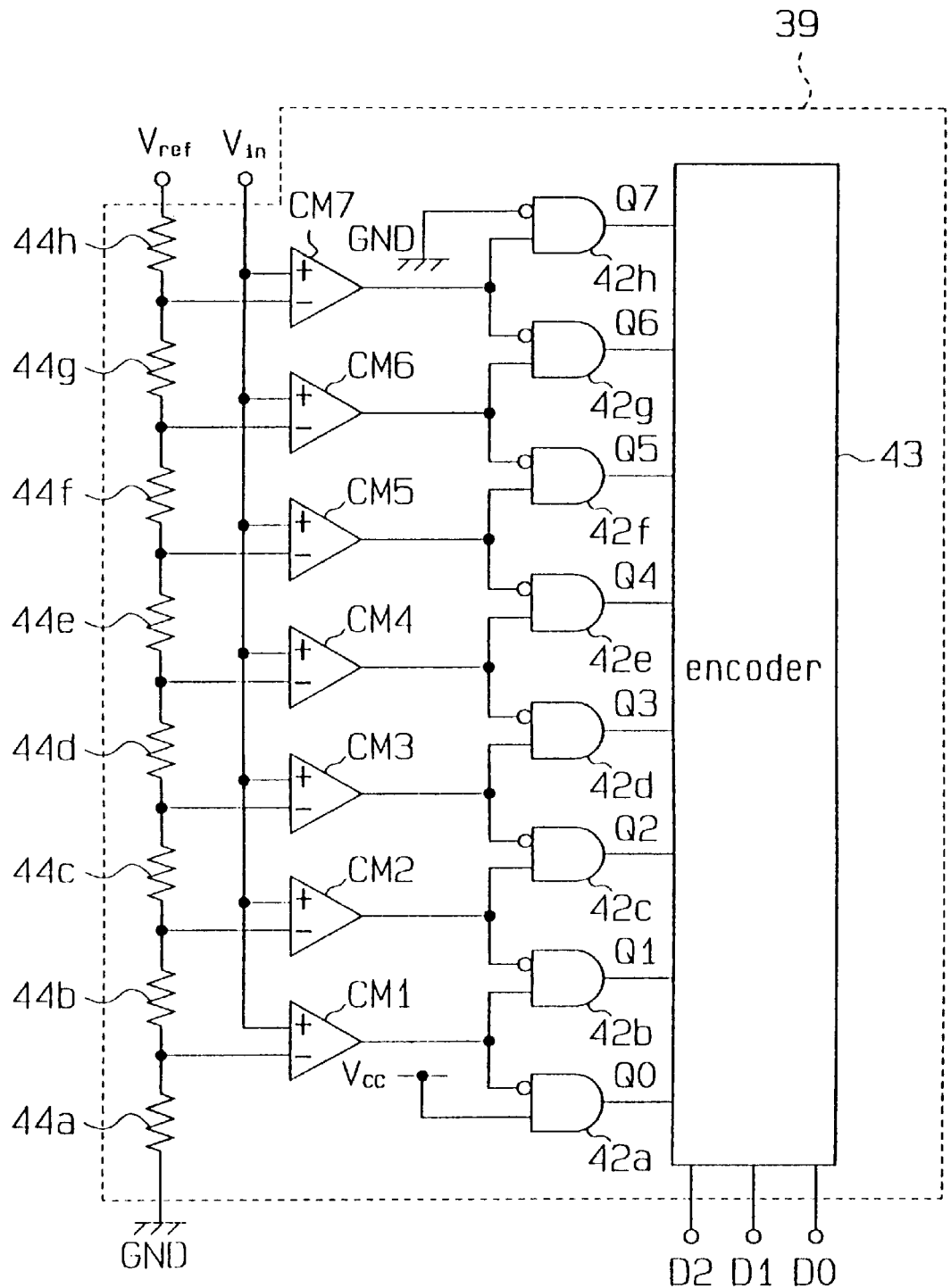

FIG. 19 shows the structure of the A/D converter 39, which is a known flash type A/D converter. The A/D converter 39 has eight string resistors 44a to 44h, seven comparators CM1 to CM7, eight AND circuits 42a to 42h and an encoder 43. Each of the comparator CM1 to CM7 has an inverting input terminal to receive a reference voltage $V_{ref}$ which is divided by the string resistors 44a to 44h and also has a non-inverting input terminal to receive the analog voltage signal LF2 as an input signal $V_{in}$ from the loop filter 21b.

The comparators CM1 to CM7 provide an output signal which switches its value between "1" and "0" between any pair of adjoining comparators. The output signal becomes a thermometer code.

The first AND gate 42a has a first input terminal to receive a signal of the power supply $V_{CC}$ level, a second input terminal to receive the inverted output signal of the first comparator CM1. The second AND gate 42b has a first input terminal to receive the output signal of the first comparator CM1 and a second input terminal to receive the inverted output signal of the second comparator CM2. The third AND gate 42c has a first input terminal to receive the output signal of the second comparator CM2 and a second input terminal to receive the inverted output signal of the third comparator CM3. The fourth AND gate 42d has a first input terminal to receive the output signal of the third comparator CM3 and a second input terminal to receive the inverted output signal of the fourth comparator CM4. The fifth AND gate 42e has a first input terminal to receive the output signal of the fourth comparator CM4 and a second input terminal to receive the inverted output signal of the fifth comparator CM5. The sixth AND gate 42f has a first input terminal to receive the output signal of the fifth comparator CM5 and a second input terminal to receive the inverted output signal of the sixth comparator CM6. The seventh AND gate 42g has a first input terminal to receive the output signal of the sixth comparator CM6 and a second input terminal to receive the inverted output signal of the seventh comparator CM7. The eighth AND gate 42h has a first input terminal to receive the output signal of the seventh comparator CM7 and a second input terminal to receive a signal having the ground GND level.

With the above structure, the AND gates 42a to 42h provide the output signals Q0 to Q7 only one of which has a high (H) level to the encoder 43. The encoder 43 provides 3-bit digital signals D0 to D2 to the host CPU 40 in response to the output signals Q0 to Q7 from the AND gates 42a to 42h.

It is apparent from the above that the synchronization accelerating circuit is constituted by the D/A converter 36, the A/D converter 39, the host CPU 40 and the center-frequency setting register 41. According to the thus constituted phase synchronizer, the host CPU 40 monitors the analog voltage signal LF2 from the loop filter 21b via the A/D converter 39. When the analog voltage signal LF2 becomes higher or lower than each of the seven-stage reference voltages to be provided to the respective comparators CM1 to CM7, the A/D converter 39 provides a digital signal according to the value of the analog voltage signal LF2 to the host CPU 40. In response to a change in the digital signal from the A/D converter 39, the host CPU 40 updates the set data value of the center-frequency setting register 41. Then the D/A converter 36 alters the voltage of the analog output to be provided to the second input terminal $T_{i2}$ of the second VCO 22b in accordance with the value of the set data value updated by the host CPU 40. As a result, the VCO 22b operates with a high gain and quickly converges the frequency of the oscillator output signal $f_{out}$ towards the frequency of the read signal $f_{in}$. Thereafter, the VCO 22b operates with a low gain in response to the analog voltage signal LF2 provided to the first input terminal $T_{i1}$, and stably converges the frequency of the oscillator output signal $f_{out}$ to the frequency of the read signal $f_{in}$.

This embodiment can therefore have the same function and advantages as the phase synchronizer of the third embodiment. Based on the switching of the digital signal of the A/D converter 39, the VCO 22b can execute the fine alteration of the operational characteristic in accordance with the analog output voltage signal provided to its own second input terminal $T_{i2}$. Therefore VCO 22b operates with a low gain in response to the analog output voltage signal to the first input terminal $T_{i1}$ and it is easy to stabilize the oscillator output signal $f_{out}$. Further, because the value of the set data of the center-frequency setting register 41 is renewed directly by the host CPU 40, the set value can be updated promptly to the one in accordance with the analog output voltage signal LF2 of the loop filter 21b. Therefore, when the frequency of the read signal $f_{in}$ changes significantly, it is possible to shorten the time needed to synchronize the oscillator output signal $f_{out}$ with the read signal $f_{in}$ as compared with the case where the set value of the center-frequency setting register 41 is counted up or counted down by "1" at a time.

Although only four embodiments of the present invention have been described herein, it should be apparent to those skilled in the art that the present invention may be embodied in many other specific forms without departing from the spirit or scope of the invention.

Therefore, the present examples and embodiments are to be considered as illustrative and not restrictive and the invention is not to be limited to the details given herein, but may be modified within the scope of the appended claims.

What is claimed is:

1. A phase synchronizer comprising:
   a feedback circuit including
      a phase comparator for generating a pulse signal in accordance with a difference between phases of an input signal and a feedback signal;
      a charge pump for converting the pulse signal supplied from said phase comparator to a first analog voltage signal;
      a loop filter for removing high-frequency signal components from the first analog voltage signal output from said charge pump, to produce a first filtered analog voltage signal; and
      a voltage-controlled oscillator having first and second terminals and being coupled to said loop filter at the first terminal, and
   a synchronization accelerating circuit coupled to receive said first filtered analog voltage signal and to the second terminal of said voltage-controlled oscillator,
   wherein when the voltage potential of said first filtered analog voltage signal is outside a predetermined voltage range, said synchronization accelerating circuit supplies said voltage-controlled oscillator with a second analog voltage signal having a voltage potential within said predetermined voltage range, and
   wherein said voltage-controlled oscillator receives one of the first filtered analog signal and the second analog signal at the corresponding terminal and generates an oscillation output signal having a larger gain with respect to the voltage potential of said second analog voltage signal than with respect to the voltage potential of said first filtered analog voltage signal in response to one of the first filtered analog signal and the second analog signal, said oscillation output signal being supplied as said feedback signal to said phase comparator and also output as a final output of said phase synchronizer.

2. The phase synchronizer according to claim 1, wherein said synchronization accelerating circuit comprises:
   a first comparator for comparing the voltage potential of said first filtered analog voltage signal with a first reference voltage, said first comparator outputting a first comparison signal at a first voltage potential level when the voltage potential of said first filtered analog voltage signal is higher than the first reference voltage;
   a second comparator for comparing the voltage potential of said first filtered analog voltage signal with a second reference voltage that is lower than said first reference voltage, said second comparator outputting a second comparison signal at a second voltage potential level when the voltage potential of said first filtered analog voltage signal is lower than the second reference voltage;

a register responsive to the first and second comparison signals supplied from said first and second comparators, and storing a preset digital value, wherein said register starts incrementing the digital value when said first comparison signal goes to the first voltage potential level, and starts decrementing the digital value when said second comparison signal goes to the second voltage potential level; and a D/A converter coupled to said register, for converting a signal indicative of the digital value stored in said register to said second analog voltage signal to be supplied to said voltage-controlled oscillator.

3. The phase synchronizer according to claim 1, wherein said synchronization accelerating circuit comprises:

an A/D converter for converting the first filtered analog voltage signal to a value signal indicative of a digital value;

a data processor, supplied with said value signal, for comparing the digital value with a reference digital value within a predetermined value range, and for outputting a comparison digital value signal based on the comparison;

a register for receiving and temporally storing the comparison digital value signal; and a D/A converter for converting the comparison digital value signal to the second analog voltage signal to be supplied to said voltage-controlled oscillator.

4. A data reproducing apparatus comprising:

a data reading unit and a controller fro the data reading unit, said data reading unit generating an oscillation output signal at a frequency synchronous with that of a record signal originating from a recording medium so as to reproduce data from the recording medium based on the oscillation output signal, wherein said data reading unit comprises
   a feedback circuit including
      a phase comparator for generating a pulse signal in accordance with a difference between phases of the record signal and a feedback signal;
      a charge pump for converting the pulse signal supplied from said phase comparator to a first analog voltage signal;
      a loop filter for removing high-frequency signal components from the first analog voltage signal output from said charge pump, to produce a first filtered analog voltage signal; and
      a voltage-controlled oscillator having first and second terminals and being coupled to said loop filter at the first terminal, and a synchronization accelerating circuit coupled to receive said first filtered analog voltage signal and to the second terminal of said voltage-controlled oscillator, wherein when the voltage potential of said first filtered analog voltage signal is outside a predetermined voltage range, said synchronization accelerating circuit supplies said voltage-controlled oscillator with a second analog voltage signal having a voltage potential within said predetermined voltage range, and wherein said voltage-controlled oscillator receives one of the first filtered analog signal and the second analog signal at the corresponding terminal and generates an oscillation output signal having a larger gain with respect to the voltage potential of said second analog voltage signal than with respect to the voltage potential of said first filtered analog voltage signal in response to one of the first filtered analog signal and the second analog signal, said oscillation output signal being supplied as said feedback signal to said phase comparator and also output as a final output of said data reading unit.

* * * * *